(12) United States Patent
Nagashima et al.

(10) Patent No.: US 10,991,713 B2
(45) Date of Patent: Apr. 27, 2021

(54) SEMICONDUCTOR MEMORY DEVICE

(71) Applicant: TOSHIBA MEMORY CORPORATION, Tokyo (JP)

(72) Inventors: Satoshi Nagashima, Yokkaichi Mie (JP); Keisuke Nakatsuka, Kobe Hyogo (JP); Fumitaka Arai, Yokkaichi Mie (JP); Shinya Arai, Yokkaichi Mie (JP); Yasuhiro Uchiyama, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/298,865

(22) Filed: Mar. 11, 2019

(65) Prior Publication Data
US 2019/0333928 A1  Oct. 31, 2019

(30) Foreign Application Priority Data

Apr. 27, 2018  (JP) .............................. JP2018-087081

(51) Int. Cl.
*H01L 27/11578* (2017.01)
*G11C 11/40* (2006.01)
*H01L 27/1157* (2017.01)

(52) U.S. Cl.
CPC ........ *H01L 27/11578* (2013.01); *G11C 11/40* (2013.01); *H01L 27/1157* (2013.01)

(58) Field of Classification Search
CPC ..... H01L 21/823412; H01L 21/823807; H01L 29/7838; H01L 27/11578; H01L 27/11582; H01L 27/11573; H01L 27/11575; H01L 27/11524; H01L 27/11529; H01L 27/1157; G11C 16/0483; G11C 16/26; G11C 16/08
See application file for complete search history.

(56) References Cited

U.S. PATENT DOCUMENTS

| | | | |
|---|---|---|---|
| 8,436,414 B2 | 5/2013 | Tanaka et al. | |
| 2008/0186771 A1* | 8/2008 | Katsumata | G11C 16/0483 365/185.17 |
| 2010/0013049 A1 | 1/2010 | Tanaka et al. | |
| 2016/0365355 A1* | 12/2016 | Pekny | H01L 27/11582 |
| 2017/0213845 A1 | 7/2017 | Baba | |
| 2017/0338243 A1 | 11/2017 | Sohn et al. | |
| 2018/0082743 A1* | 3/2018 | Bushnaq | H01L 27/1157 |
| 2018/0082753 A1* | 3/2018 | Maejima | G11C 16/3427 |

FOREIGN PATENT DOCUMENTS

| | | |
|---|---|---|
| JP | 2010-027870 A | 2/2010 |
| JP | 2010-192569 A | 9/2010 |
| TW | 201727636 A | 8/2017 |

* cited by examiner

*Primary Examiner* — Thanh Y. Tran
(74) *Attorney, Agent, or Firm* — Foley & Lardner LLP

(57) ABSTRACT

According to one embodiment, a semiconductor memory device includes: first and second signal lines; a first memory cell storing first information by applying voltage across the first signal line and a first interconnect layer; a second memory cell storing second information by applying voltage across the second signal line and a second interconnect layer; a first conductive layer provided on the first and second signal lines; third and fourth signal lines provided on the first conductive layer; a third memory cell storing third information by applying voltage across the third signal line and a third interconnect layer; and a fourth memory cell storing fourth information by applying voltage across the fourth signal line and a fourth interconnect layer.

15 Claims, 30 Drawing Sheets

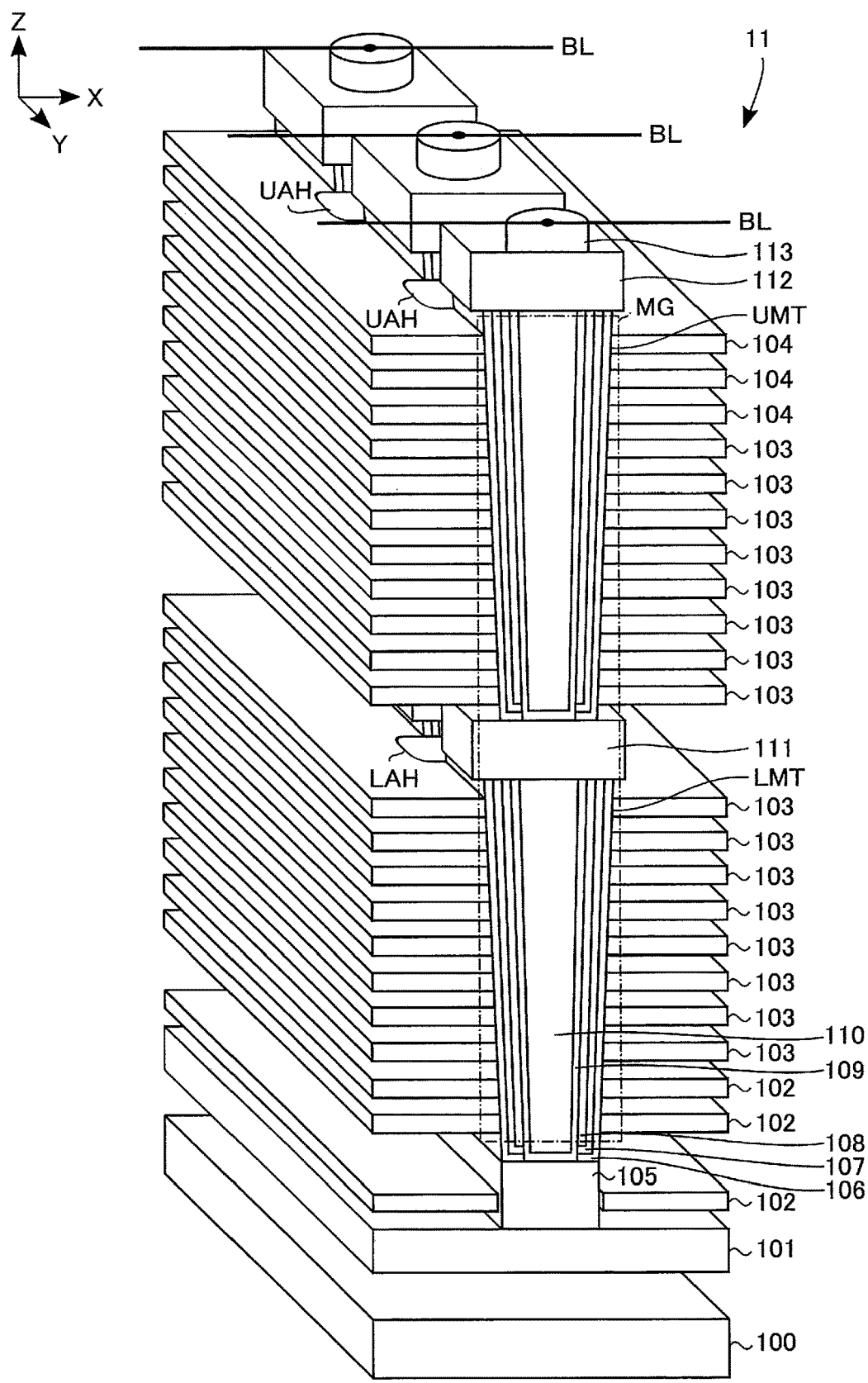
F I G. 3

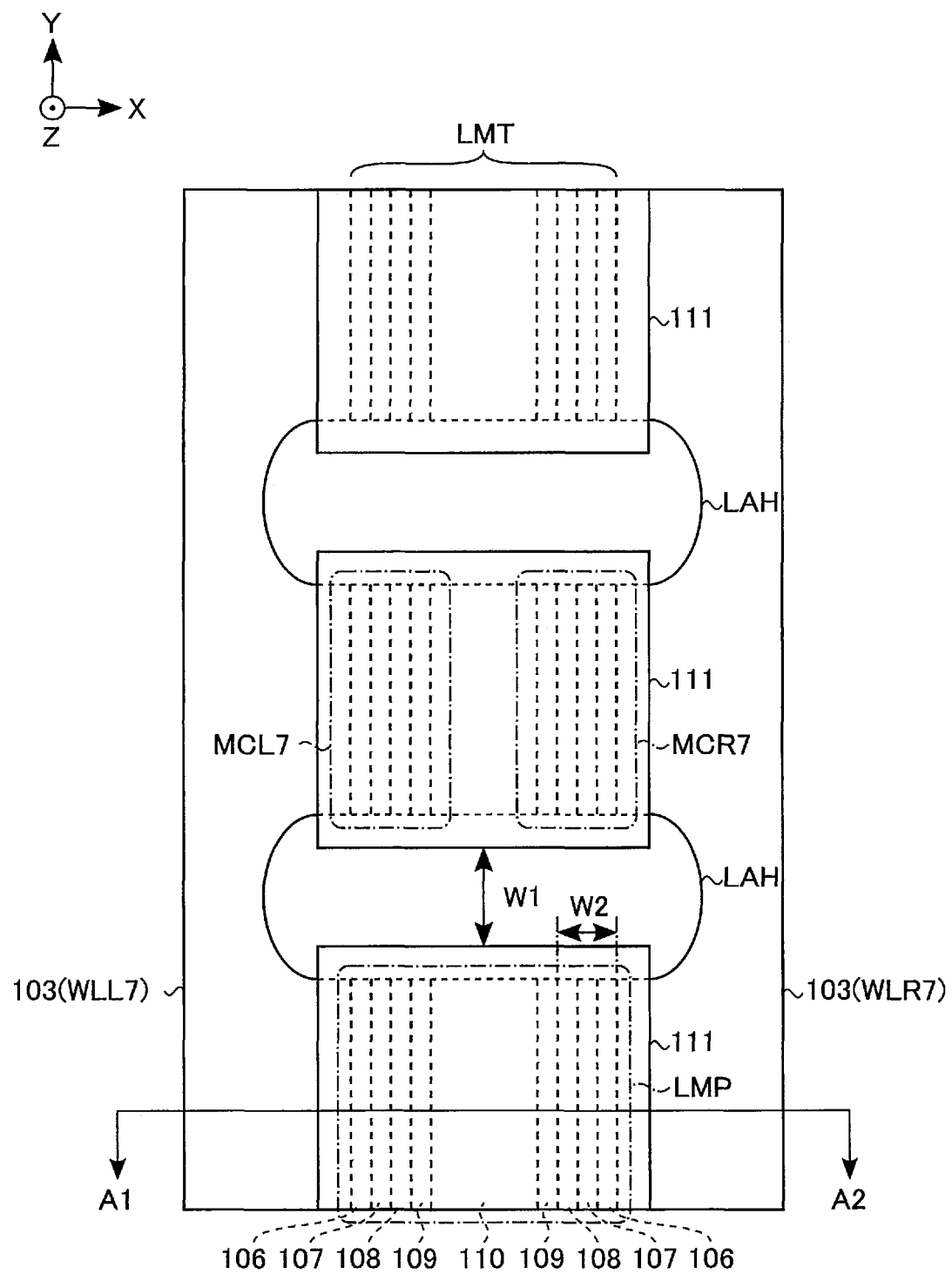
F I G. 4

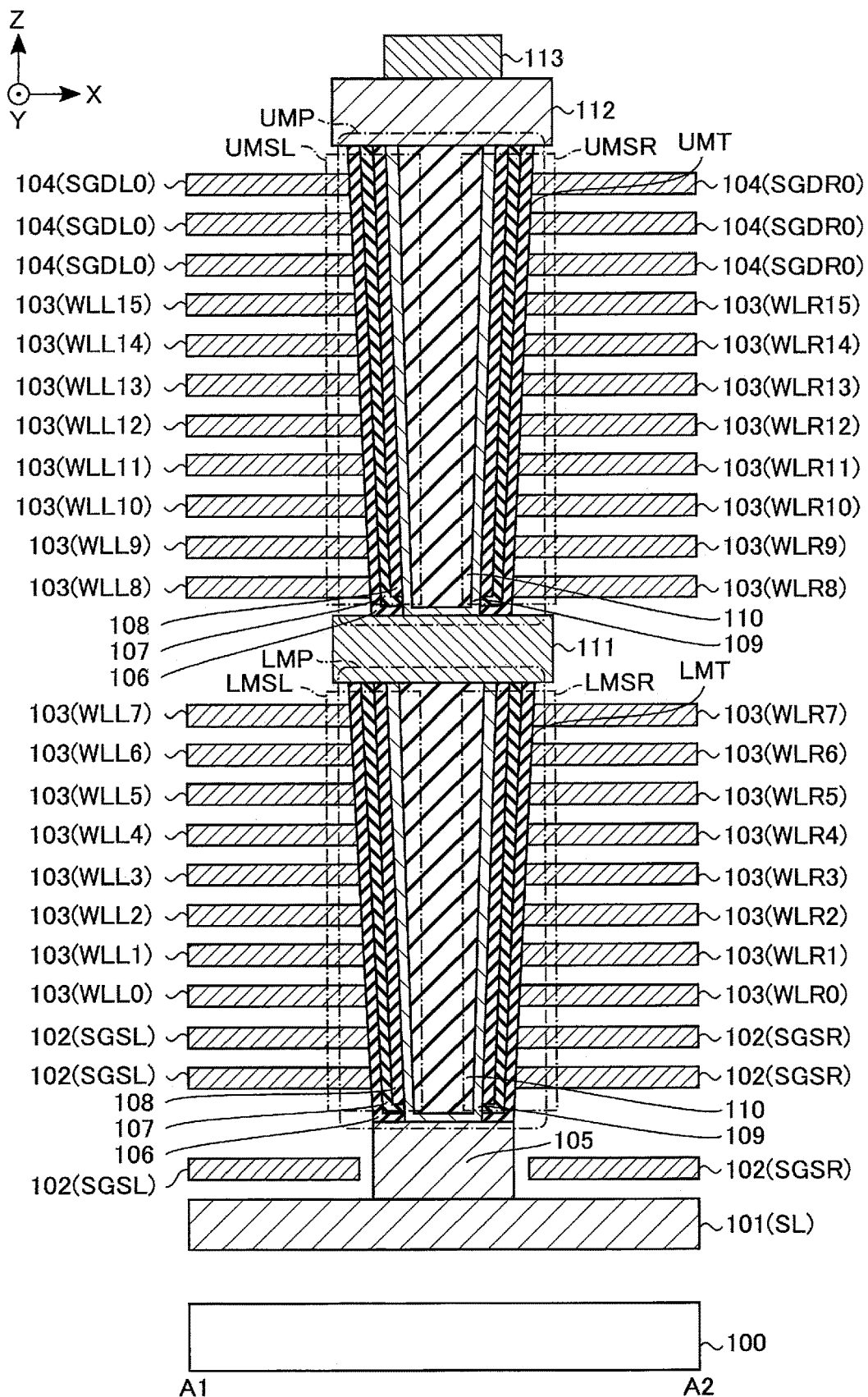
F I G. 5

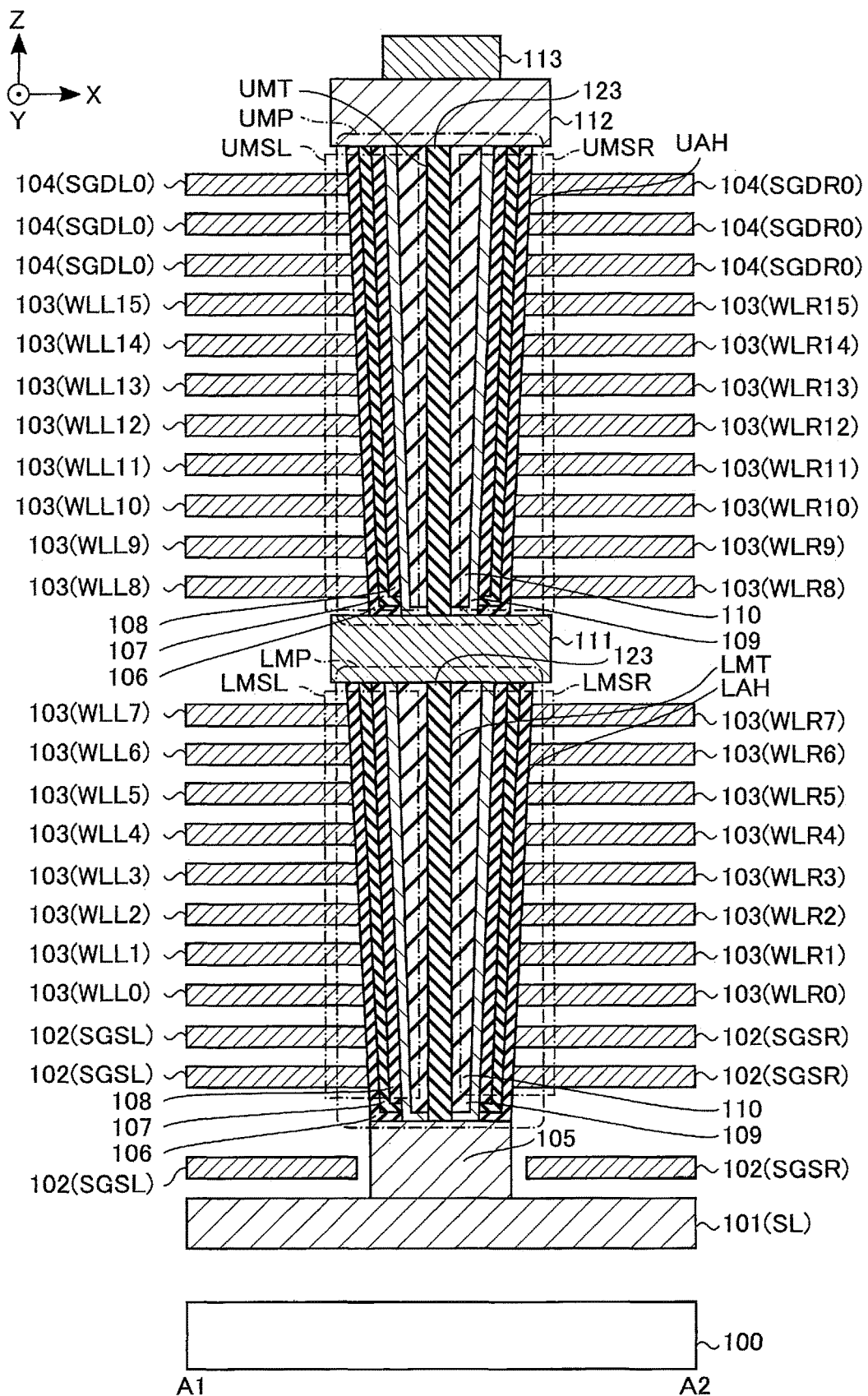
F I G. 19

US 10,991,713 B2

SEMICONDUCTOR MEMORY DEVICE

CROSS-REFERENCE TO RELATED APPLICATIONS

This application is based upon and claims the benefit of priority from Japanese Patent Application No. 2018-087081, filed Apr. 27, 2018, the entire contents of which are incorporated herein by reference.

FIELD

Embodiments described herein relate generally to a semiconductor memory device.

BACKGROUND

A NAND-type flash memory is known as a semiconductor memory device.

BRIEF DESCRIPTION OF THE DRAWINGS

FIG. 3 is a perspective view of a memory cell array provided in a semiconductor memory device according to the first embodiment;

FIG. 4 is a plan view of a conductive layer 111 in a memory cell array provided in a semiconductor memory device according to the first embodiment;

FIG. 5 is a sectional view of a memory cell array provided in a semiconductor memory device according to the first embodiment;

FIG. 19 is a sectional view of a memory cell array provided in a semiconductor memory device according to the third embodiment;

DETAILED DESCRIPTION

In general, according to one embodiment, a semiconductor memory device includes: a semiconductor substrate; a first signal line extending in a first direction; a second signal line disposed apart from the first signal line in a second direction and extending in the first direction, the second direction crossing the first direction and being parallel to the semiconductor substrate; a first insulating layer provided between the first signal line and the second signal line; a first interconnect layer provided above the semiconductor substrate and extending in a third direction, the third direction crossing the first and second directions and being parallel to the semiconductor substrate; a second interconnect layer extending in the third direction; a first memory cell which stores first information by applying voltage across the first signal line and the first interconnect layer; a second memory cell which stores second information by applying voltage across the second signal line and the second interconnect layer; a first conductive layer provided on the first signal line and the second signal line; a third interconnect layer provided above the first interconnect layer and extending in the third direction; a fourth interconnect layer located apart from the third interconnect layer in the second direction and extending in the third direction; a third signal line provided on the first conductive layer and extending in the first direction; a fourth signal line provided on the first conductive layer, disposed apart from the third signal line in the second direction, and extending in the first direction; a second insulating layer provided between the third signal line and the fourth signal line; a third memory cell which stores third information by applying voltage across the third signal line and the third interconnect layer; and a fourth memory cell which stores fourth information by applying voltage across the fourth signal line and the fourth interconnect layer.

1. First Embodiment

A semiconductor memory device according to a first embodiment will be described. Hereinafter, a three-dimensionally stacked NAND-type flash memory in which memory cell transistors are three-dimensionally stacked above a semiconductor substrate will be described as an example of a semiconductor memory device.

1.1 Structure 1.1.1 Overall Structure of Semiconductor Memory Device

Figure 1:
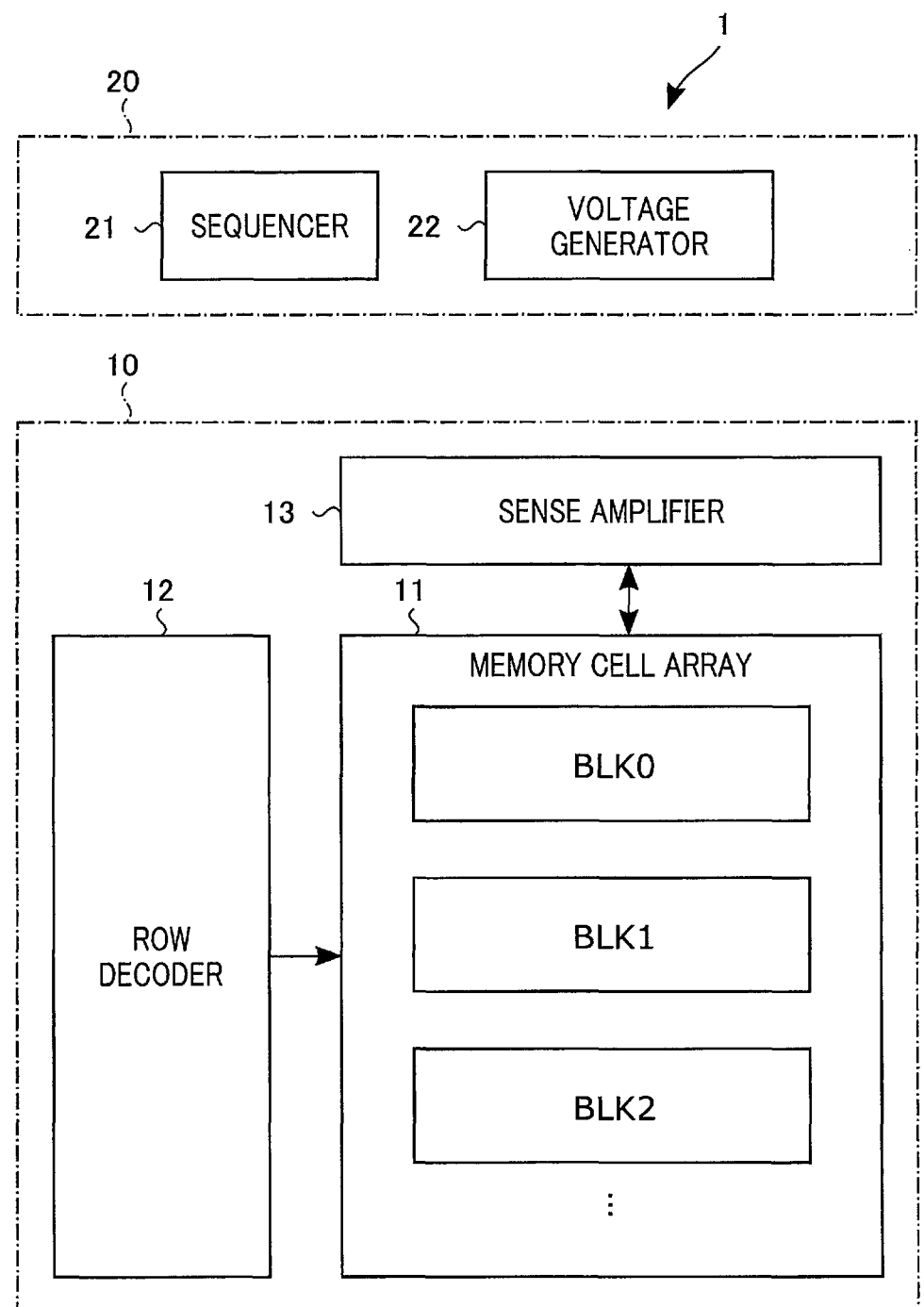
FIG. 1 is a block diagram of a semiconductor memory device according to a first embodiment.

First, the overall structure of a semiconductor memory device will be described with reference to FIG. 1. FIG. 1 is an example of a block diagram illustrating the basic overall structure of a semiconductor memory device. Although a part of coupling between blocks is indicated by arrow lines in FIG. 1, it is to be noted that coupling between blocks is not limited thereto.

As illustrated in FIG. 1, a semiconductor memory device 1 roughly includes a memory core unit 10 and a peripheral circuit unit 20.

The memory core unit 10 includes a memory cell array 11, a row decoder 12, and a sense amplifier 13.

The memory cell array 11 is provided with a plurality of blocks BLK. Although three blocks BLK0 to BLK2 are illustrated in the example of FIG. 1, the number is not limited. Each block BLK includes a plurality of three-dimensionally stacked memory cell transistors associated with rows and columns.

The row decoder 12 decodes a row address received from an external controller (not shown). The row decoder 12 then selects the row direction of the memory cell array 11 based on the result of decoding. More specifically, voltage is applied to various interconnects to be used for selecting the row direction.

The sense amplifier 13 senses data read from any block BLK in a read operation. The sense amplifier 13 applies voltage corresponding to written data to the memory cell array 11 in a write operation.

The peripheral circuit unit 20 includes a sequencer 21 and a voltage generator 22.

The sequencer 21 controls the operation of the entire semiconductor memory device 1. More specifically, the sequencer 21 controls the voltage generator 22, the row decoder 12, the sense amplifier 13, and the like in write operation, read operation, and erase operation.

The voltage generator 22 generates voltage required for the write operation, the read operation, and the erase operation, and supplies the voltage to the row decoder 12, the sense amplifier 13, and the like.

1.1.2 Circuit Structure of Memory Cell Array

Figure 2:
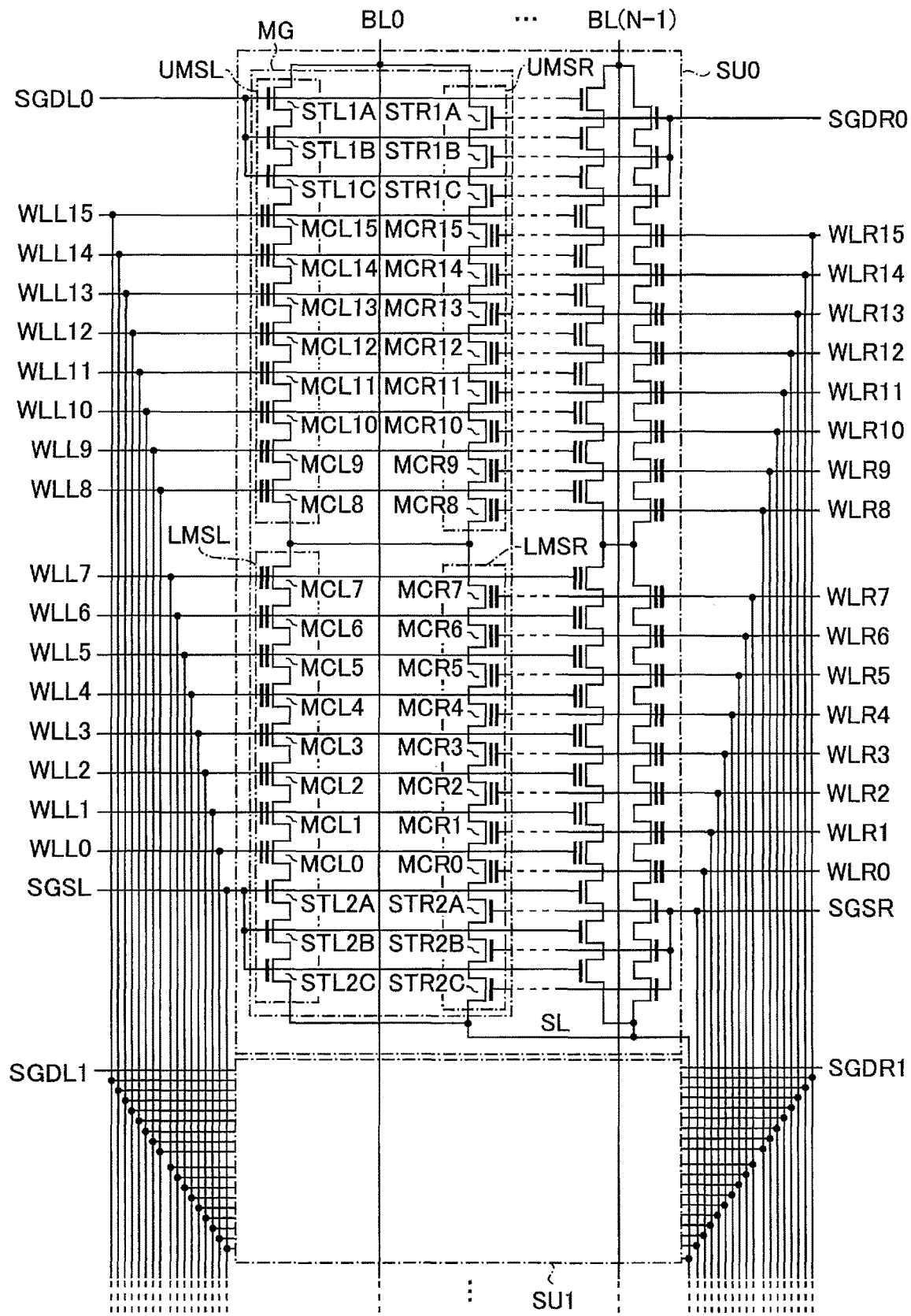
FIG. 2 is a circuit diagram of a memory cell array provided in a semiconductor memory device according to the first embodiment.

Next, the circuit structure of the memory cell array 11 will be described with reference to FIG. 2. FIG. 2 illustrates a circuit diagram of the memory cell array 11 in one block BLK. As illustrated in FIG. 2, each block BLK includes a plurality of string units SU (SU0, SU1, . . . ). Each string unit SU includes a plurality of memory groups MG. Each of the memory groups MG includes four memory strings LMSL, LMSR, UMSL, and UMSR. The memory strings LMSL and LMSR are coupled in parallel, and the memory strings UMSL and UMSR are coupled in parallel. The memory strings LMSL and LMSR coupled in parallel are coupled in series to the memory strings UMSL and UMSR coupled in parallel. Hereinafter, when the memory strings LMSL and LMSR are not to be specified, they are each expressed as a memory string LMS, and when the memory strings UMSL and UMSR are not to be specified, they are each expressed as a memory string UMS. Furthermore, when the memory strings LMS and UMS are not to be specified, they are each expressed as a memory string MS. It is to be noted that the number of memory strings MS included in one memory group MG is not limited to four. Each memory group MG may include 2m (m is an integer of 3 or more) or more memory strings MS.

The memory string LMSL includes, for example, eight memory cell transistors MCL0 to MCL7, and three selection transistors STL2A, STL2B, and STL2C. Similarly, the memory string LMSR includes, for example, eight memory cell transistors MCR0 to MCR7, and three selection transistors STR2A, STR2B, and STR2C. Moreover, the memory string UMSL includes, for example, eight memory cell transistors MCL8 to MCL15, and three selection transistors STL1A, STL1B, and STL1C. The memory string UMSR includes, for example, eight memory cell transistors MCR8 to MCR15, and three selection transistors STR1A, STR1B, and STR1C.

Hereinafter, when the memory cell transistors MCL0 to MCL15 are not to be specified, they are each expressed as a memory cell transistor MCL, and when MCR0 to MCR15 are not to be specified, they are each expressed as a memory cell transistor MCR. Furthermore, when the memory cell transistors MCL and MCR are not to be specified, they are each expressed as a memory cell transistor MC. Moreover, when the selection transistors STL1A to STL1C and STR1A to STR1C are not to be specified, they are each expressed as a selection transistor ST1. When the selection transistors STL2A to STL2C and STR2A to STR2C are not to be specified, they are each expressed as a selection transistor ST2.

Each memory cell transistor MC is provided with a control gate and a charge storage layer and holds data in a nonvolatile manner. It is to be noted that the memory cell transistor MC may be of MONOS type using an insulating layer as a charge storage layer, or of FG type using a conductive layer as a charge storage layer. Hereinafter, an MONOS type will be described as an example in the present embodiment. Moreover, the number of memory cell transistors MC included in each of the memory strings MS may be 16, 32, 48, 64, 96, 128, or the like, and the number is not limited. Furthermore, the number of the selection transistors ST2 included in each of the memory strings LMS, and the number of the selection transistors ST1 included in each of the memory strings UMS are each arbitrary and may be one or more.

The memory cell transistors MC and the selection transistors ST2 included in the memory string LMSL are respectively coupled in series. More specifically, current paths of the selection transistors STL2C, STL2B, and STL2A, and the memory cell transistors MCL0 to MCL7 are coupled in series. Similarly, current paths of the selection transistors STR2C, STR2B, and STR2A, and the memory cell transistors MCR0 to MCR7 included in the memory string LMSR are coupled in series. In addition, the drain of the memory cell transistor MCL7 is coupled to the drain of the memory cell transistor MCR7. The source of the selection transistor STL2C and the source of the selection transistor STR2C are commonly coupled to the source line SL.

Current paths of the memory cell transistors MCL8 to MCL15 and the selection transistors STL1C, STL1B, and STL1A included in the memory string UMSL are coupled in series. Similarly, current paths of the memory cell transistors MCR8 to MCR15 and the selection transistors STR1C, STR1B, and STR1A included in the memory string UMSR are coupled in series. In addition, the source of the memory cell transistor MCL8, the source of the memory cell transistor MCR8, the drain of the memory cell transistor MCL7, and the drain of the memory cell transistor MCR7 are commonly coupled to each other. The drain of the selection transistor STL1A and the drain of the selection transistor STR1A are commonly coupled to any one of a plurality of bit lines BL (BL0, . . . , BL (N−1), where (N−1) is an integer of 2 or more).

Selection gate lines SGDL (SGDL0, SGDL1, . . . ) and selection gate lines SGDR (SGDR0, SGDR1, . . . ) are provided corresponding to the string units SU (SU0, SU1, . . . ). In addition, the gates of the plurality of selection transistors STL1A, STL1B, and STL1C in each string unit SU are commonly coupled to the corresponding selection gate line SGDL. Similarly, the gates of the plurality of selection transistors STR1A, STR1B, and STR1C in each string unit SU are commonly coupled to the corresponding select gate line SGDR. Hereinafter, when the selection gate lines SGDL and SGDR are not to be specified, they are each expressed as a selection gate line SGD. Each selection gate line SGD is independently controlled by the row decoder 12.

Selection gate lines SGSL and SGSR are provided corresponding to the block BLK. In addition, the gates of the plurality of selection transistors STL2A, STL2B, and STL2C in the same block BLK are commonly coupled to the corresponding selection gate line SGSL, and the gates of the selection transistors STR1A, STR2B, and STR2C are commonly coupled to the corresponding selection gate line SGSR. The selection gate lines SGSL and SGSR may be commonly coupled to, for example, the row decoder 12, and may be independently controlled by the row decoder 12. Hereinafter, when the selection gate lines SGSL and SGSR are not to be specified, they are each expressed as a selection gate line SGS.

The control gates of the memory cell transistors MCL0 to MCL15 and MCR0 to MCR15 in the same block BLK are commonly coupled to word lines WLL0 to WLL15 and WLR0 to WLR15 provided for each block BLK. The word lines WLL0 to WLL15 and WLR0 to WLR15 are independently controlled by the row decoder 12. Hereinafter, when the word lines WLL and WLR are not to be specified, they are each expressed as a word line WL.

Each block BLK is, for example, an erasure unit of data, and data held in memory cell transistors MC included in the same block BLK are erased in a batch. Moreover, the write operation and the read operation are performed in a batch for a plurality of memory cell transistors MC commonly coupled to one word line WL of one string unit SU.

In the memory cell array 11, the drain of the selection transistor STL1A and the drain of STR1A of the memory group MG in the same column are commonly coupled to any one of the bit lines BL. That is, the bit line BL commonly couples memory groups MG between a plurality of string units SU. That is, each string unit SU includes a plurality of memory groups MG coupled to different bit lines BL and coupled to the same selection gate line SGD. Moreover, each block BLK includes a plurality of string units SU that share the word line WL. In addition, the memory cell array 11 includes a plurality of blocks BLK that share the bit line BL. In the memory cell array 11, the selection gate line SGS, the word line WL, and the selection gate line SGD are stacked above the semiconductor substrate, so that the memory cell transistors MC are three-dimensionally stacked.

1.1.3 Overall Structure of Memory Cell Array

Next, the overall structure of the memory cell array 11 will be described with reference to FIG. 3. FIG. 3 is a perspective view corresponding to one block BLK of the memory cell array 11. It is to be noted that some insulating films are omitted in the example of FIG. 3.

As illustrated in FIG. 3, an interconnect layer 101 extending in an XY plane parallel to the semiconductor substrate 100 is formed above the semiconductor substrate 100. The interconnect layer 101 functions as a source line SL. Above the interconnect layer 101, three interconnect layers 102 extending in the Y direction are stacked to be spaced apart in the Z direction perpendicular to the semiconductor substrate 100, that is, with an interlayer insulating film (not shown) interposed between the respective layers. The interconnect layer 102 functions as a selection gate line SGS, or a gate electrode for generating erasure current in the erase operation. On a part of the upper surface of the interconnect layer 101, a semiconductor layer 105 extending in the Y direction is formed so as to separate the lowermost interconnect layer 102 in the X direction. The upper surface of the semiconductor layer 105 is located higher than the upper surface of the lowermost interconnect layer 102, and lower than the bottom surface of the intermediate interconnect layer 102.

Above the three interconnect layers 102, eight interconnect layers 103 extending in the Y direction and functioning as word lines WL0 to WL7 are stacked to be spaced apart in the Z direction. In addition, a memory trench LMT extending in the Y direction is formed on the semiconductor layer 105 so as to space the eight interconnect layers 103 and the upper two interconnect layers 102 apart in the X direction. On a side surface of the memory trench LMT, a block insulating film 106, a charge storage layer 107, and a tunnel insulating film 108 are stacked in order. In addition, a semiconductor layer 109 having a side surface in contact with a side surface of the tunnel insulating film 108 and a bottom surface in contact with the semiconductor layer 105 is formed. Furthermore, the inside of the semiconductor layer 109 in the memory trench LMT is filled with the core layer 110.

A plurality of holes LAH each having a bottom surface reaching the semiconductor layer 105 are formed along the Y direction so as to separate the memory trench LMT extending in the Y direction in the Y direction. Hereinafter, one of the separated memory trenches LMT will be referred to as a memory pillar LMP. One memory pillar LMP functions as memory strings LMSL and LMSR of one memory group MG.

Conductive layers 111 are formed respectively on the plurality of memory pillars LMP arranged along the Y direction.

Above the conductive layer 111, eight interconnect layers 103 functioning as word lines WL8 to WL15 extending in the Y direction, and three interconnect layers 104 functioning as selection gate lines SGD extending in the Y direction are stacked to be spaced apart in the Z direction. In addition, a memory trench UMT extending in the Y direction and having a bottom surface partly reaching the conductive layer 111 is formed so as to space the eight interconnect layers 103 and the three interconnect layers 104 apart in the X direction. As with the memory trench LMT, the memory trench UMT is filled with the block insulating film 106, the charge storage layer 107, the tunnel insulating film 108, the semiconductor layer 109, and the core layer 110.

A plurality of holes UAH each having a bottom surface reaching the hole LAH or the conductive layer 111 are formed along the Y direction so as to separate the memory trench UMT in the Y direction. Hereinafter, one of the separated memory trenches UMT will be referred to as a memory pillar UMP. One memory pillar UMP functions as memory strings UMSL and UMSR of one memory group MG. Hereinafter, when the memory pillars LMP and UMP are not to be specified, they are each expressed as a memory pillar MP.

Each memory group MG includes memory pillars LMP and UMP, and a conductive layer 111 which electrically couples the memory pillar LMP and the memory pillar UMP.

Conductive layers 112 are formed respectively on the plurality of memory pillars UMP arranged along the Y direction. In addition, a contact plug 113 is formed on each conductive layer 112. The upper surface of the contact plug 113 is coupled to, for example, a bit line BL extending in the X direction.

1.1.4 Planar Structure of Memory Cell Array

Next, the planar structure of the memory cell array 11 will be described with reference to FIG. 4. FIG. 4 illustrates the plane of the conductive layer 111 in the XY plane parallel to the semiconductor substrate 100. It is to be noted that interlayer insulating films are omitted in the example of FIG. 4.

As illustrated in FIG. 4, the word line WLL7 (interconnect layer 103) and the word line WLR7 (interconnect layer 103) extending in the Y direction are arranged adjacent to each other in the X direction. Between the word lines WLL7 and WLR7, a plurality of memory pillars LMP and a plurality of holes LAH are alternately arranged along the Y direction.

The block insulating film 106, the charge storage layer 107, the tunnel insulating film 108, and the semiconductor layer 109 are sequentially stacked on two side surfaces of the memory pillar LMP extending in the Y direction, and the inside of the memory pillar LMP is filled with the core layer 110. A side surface of the memory pillar LMP extending in the X direction is in contact with the block insulating film 106, the charge storage layer 107, the tunnel insulating film 108, the semiconductor layer 109, and the core layer 110. That is, the block insulating film 106, the charge storage layer 107, the tunnel insulating film 108, and the semiconductor layer 109 in contact with two side surfaces of the memory pillar MP are separated from each other in the X direction. In the example of FIG. 4, the memory cell transistor MCL7 is formed of a region including the word line WLL7 and the block insulating film 106, the charge storage layer 107, the tunnel insulating film 108, and the semiconductor layer 109 formed on the left side surface of the memory pillar LMP, and the memory cell transistor MCR7 is formed of a region including the word line WLR7 and the block insulating film 106, the charge storage layer 107, the tunnel insulating film 108, and the semiconductor layer 109 formed on the right side surface of the memory pillar LMP.

The holes LAH are provided for separating the memory trench LMT in the Y direction. Therefore, the length (width) of each hole LAH in the X direction is longer than the length (width) of the memory trench LMT in the X direction, that is, of the memory pillar LMP.

On the memory pillar LMP, a conductive layer 111 is provided so as to cover the upper surface of the memory pillar LMP. The conductive layer ill functions as an etching stopper for protecting the upper surface of the memory pillar LMP in processing the memory trench UMT. Therefore, the lengths of the conductive layer 111 in the X direction and the Y direction are longer than the lengths of the memory pillar LMP in the X direction and the Y direction.

The distance between two conductive layers 111 arranged along the Y direction is denoted by W1, and the width (film thickness) of the block insulating film 106, the charge storage layer 107, and the tunnel insulating film 108 in the X direction in the memory trench UMT (not shown) is denoted by W2. Then, it is preferable that the distance W1 is equal to or less than twice the width W2, that is, $W1 \leq 2 \times W2$ is satisfied. In a case in which such relationship is satisfied, even when a hole LAH between the conductive layers 111 is processed in processing the memory trench UMT, a processing region in the hole LAH is filled with the block insulating film 106, the charge storage layer 107, and the tunnel insulating film 108 in the process of filling the memory trench UMT, so that the semiconductor layer 109 does not enter the hole LAH.

1.1.5 Sectional Structure of Memory Cell Array

Next, the sectional structure of the memory cell array 11 will be described with reference to FIG. 5. FIG. 5 is a sectional view of the memory cell array 11 taken along line A1-A2 in FIG. 4. It is to be noted that interlayer insulating films are omitted in FIG. 5.

As illustrated in FIG. 5, an interconnect layer 101 functioning as a source line is formed above the semiconductor substrate 100 with an interlayer insulating film (not shown) interposed therebetween. Polycrystalline silicon doped with phosphorus (P), for example, is used for the interconnect layer 101. It is to be noted that a circuit such as the row decoder 12 or the sense amplifier 13 may be provided between the semiconductor substrate 100 and the interconnect layer 101.

Above the interconnect layer 101, three interconnect layers 102 functioning as selection gate lines SGSL and SGSR, and eight interconnect layers 103 functioning as word lines WL0 to WL7 are sequentially stacked with interlayer insulating films (not shown) interposed between the respective layers. The interconnect layer 102 and the interconnect layer 103 are made of conductive material, and, for example, an n-type semiconductor or a p-type semiconductor doped with impurities, or metal material is used. In the present embodiment, a case in which tungsten (W) and titanium nitride (TiN) are used for the interconnect layers 102 and 103 will be described. TiN functions as barrier metal and an adhesion layer in forming W.

On the interconnect layer 101, the semiconductor layer 105 is provided so as to separate the lowermost interconnect layer 102 in the X direction. Silicon formed by selective CVD (chemical vapor deposition), for example, is used for the semiconductor layer 105.

A memory trench LMT is formed on the semiconductor layer 105, and a memory pillar LMP including the block insulating film 106, the charge storage layer 107, the tunnel insulating film 108, the semiconductor layer 109, and the core layer 110 is formed in the memory trench LMT. A silicon oxide film ($SiO_2$) for example, is used for the block insulating film 106, the tunnel insulating film 108, and the core layer 110. A silicon nitride film (SiN) or hafnium oxide (HfO), for example, is used for the charge storage layer. The semiconductor layer 109 is a region where a channel of the memory cell transistor MC is formed. Hence, the semiconductor layer 109 functions as a signal line which couples current paths of the memory cell transistors MC. Polycrystalline silicon, for example, is used for the semiconductor layer 109.

In the example of FIG. 5, the interconnect layer 102 disposed on the left side of the page with respect to the semiconductor layer 105 and the memory pillar LMP functions as the selection gate line SGSL, and eight interconnect layers 103 function as the word lines WLL0 to WLL7 from the lower layer. For example, the memory cell transistor MCL0 is formed of a region including the interconnect layer 103 functioning as the word line WLL0 and a part of the block insulating film 106, the charge storage layer 107, the tunnel insulating film 108, and the semiconductor layer 109 provided on the left side surface of the memory pillar LMP. The same applies to the other memory cell transistors MCL1 to MCL7 and the selection transistors STL2A to STL2C.

Moreover, the interconnect layer 102 disposed on the right side of the page functions as the selection gate line SGSR, and eight interconnect layers 103 function as the word lines WLR0 to WLR7 from the lower layer. For example, the memory cell transistor MCR0 is formed of a region including the interconnect layer 103 functioning as the word line WLR0 and a part of the block insulating film 106, the charge storage layer 107, the tunnel insulating film 108, and the semiconductor layer 109 provided on the right side surface of the memory pillar LMP. The same applies to the other memory cell transistors MCR1 to MCR7 and the selection transistors STR2A to STR2C.

Accordingly, the memory cell transistors MCL0 and MCR0 are formed in the same layer, and the interconnect layer 103, the charge storage layer 107, and the semiconductor layer 109 corresponding to each of the memory cell transistors MCL0 and MCR0 are separated from each other in the same layer (XY plane). That is, the channels of the memory cell transistors MCL0 and MCR0 are separated from each other. The same applies to the other memory cell transistors MCL and MLR. Moreover, the same applies to the selection transistors STL2A to STL2C and STR2A to STL2C, and, for example, the selection transistors STL2A and STR2A are formed in the same layer.

A conductive layer 111 is formed on the memory pillar LMP. The conductive layer 111 is made of conductive material, and, for example, an n-type semiconductor using polycrystalline silicon is used.

Above the conductive layer 111, eight interconnect layers 103 functioning as word lines WL8 to WL15, and three interconnect layers 104 functioning as selection gate lines SGD are sequentially stacked with interlayer insulating films (not shown) interposed between the respective layers. As with the interconnect layers 102 and 103, the interconnect layer 104 is made of conductive material, and, for example, an n-type semiconductor or a p-type semiconductor doped with impurities, or metal material is used. In the present embodiment, a case in which W and TiN are used for the interconnect layer 104 as with the interconnect layers 102 and 103 will be described.

A memory trench UMT is formed on the conductive layer 111, and a memory pillar UMP including the block insulating film 106, the charge storage layer 107, the tunnel insulating film 108, the semiconductor layer 109, and the core layer 110 is formed in the memory trench UMT. Accordingly, the conductive layer 111 is in contact with the semiconductor layers 109 of the memory pillars LMP and UMP. That is, channels of the memory strings LMSL, LMSR, UMSL, and UMSR are electrically coupled to each other via the conductive layer 111.

In the example of FIG. 5, eight interconnect layers 103 arranged on the left side of the page with respect to the memory pillar UMP function as word lines WLL8 to WLL15 from the lower layer, and the interconnect layer 104 functions as the selection gate line SGDL. For example, the memory cell transistor MCL8 is formed of a region including the interconnect layer 103 functioning as the word line WLL8 and a part of the block insulating film 106, the charge storage layer 107, the tunnel insulating film 108, and the semiconductor layer 109 provided on the left side surface of the memory pillar UMP. The same applies to the other memory cell transistors MCL9 to MCL15 and the selection transistors STL1A to STL1C.

Moreover, eight interconnect layers 103 arranged on the right side of the page function as word lines WLR8 to WLR15 from the lower layer, and the interconnect layer 104 functions as the selection gate line SGDR. For example, the memory cell transistor MCR8 is formed of a region including the interconnect layer 103 functioning as the word line WLR8 and a part of the block insulating film 106, the charge storage layer 107, the tunnel insulating film 108, and the semiconductor layer 109 provided on the right side surface of the memory pillar UMP. The same applies to the other memory cell transistors MCR9 to MCR15 and the selection transistors STR1A to STR1C.

A conductive layer 112 is formed on the memory pillar UMP. The conductive layer 112 is made of conductive material, and, for example, polycrystalline silicon is used. Moreover, a contact plug 113 to be coupled to the bit line BL is formed on the conductive layer 112. The contact plug 113 is made of conductive material, and, for example, W and TiN are used. A bit line BL (not shown) is formed on the contact plug 113.

It is to be noted that three or more stages of the memory pillars MP may be stacked. In such a case, a conductive layer 111 is provided between the respective memory pillars MP.

1.2 Manufacturing Method of Memory Cell Array

Next, a method of manufacturing the memory cell array 11 will be described with reference to FIGS. 6 to 14. FIGS. 6 to 14 respectively illustrate the upper surface (array upper surface) of the memory cell array in the manufacturing process, and the cross section (A1-A2 cross section) taken along line A1-A2. In the present embodiment, a case in which a method of first forming a structure corresponding to the interconnect layers 102, 103, and 104 with sacrificial layers 121, and then forming the interconnect layers 102, 103, and 104 by removing the sacrifice layers 121 and then filling the space with the conductive material (hereinafter referred to as "backfilling") is used will be described. Hereinafter, a case in which a silicon nitride film (SiN) is used as a sacrificial layer 121 and W and TiN are used as the conductive material of the interconnect layers 102, 103, and 104 will be described. TiN functions as a barrier layer for preventing the reaction between, for example, W and the underlying Si in W deposition, or as an adhesion layer for improving the adhesiveness of W. It is to be noted that the sacrificial layers 121 are not limited to SiN. For example, a silicon oxynitride film (SiON) may be used, or any other material may be used as long as the material provides a sufficient selective ratio of wet etching with the interlayer insulating film.

Figure 6:
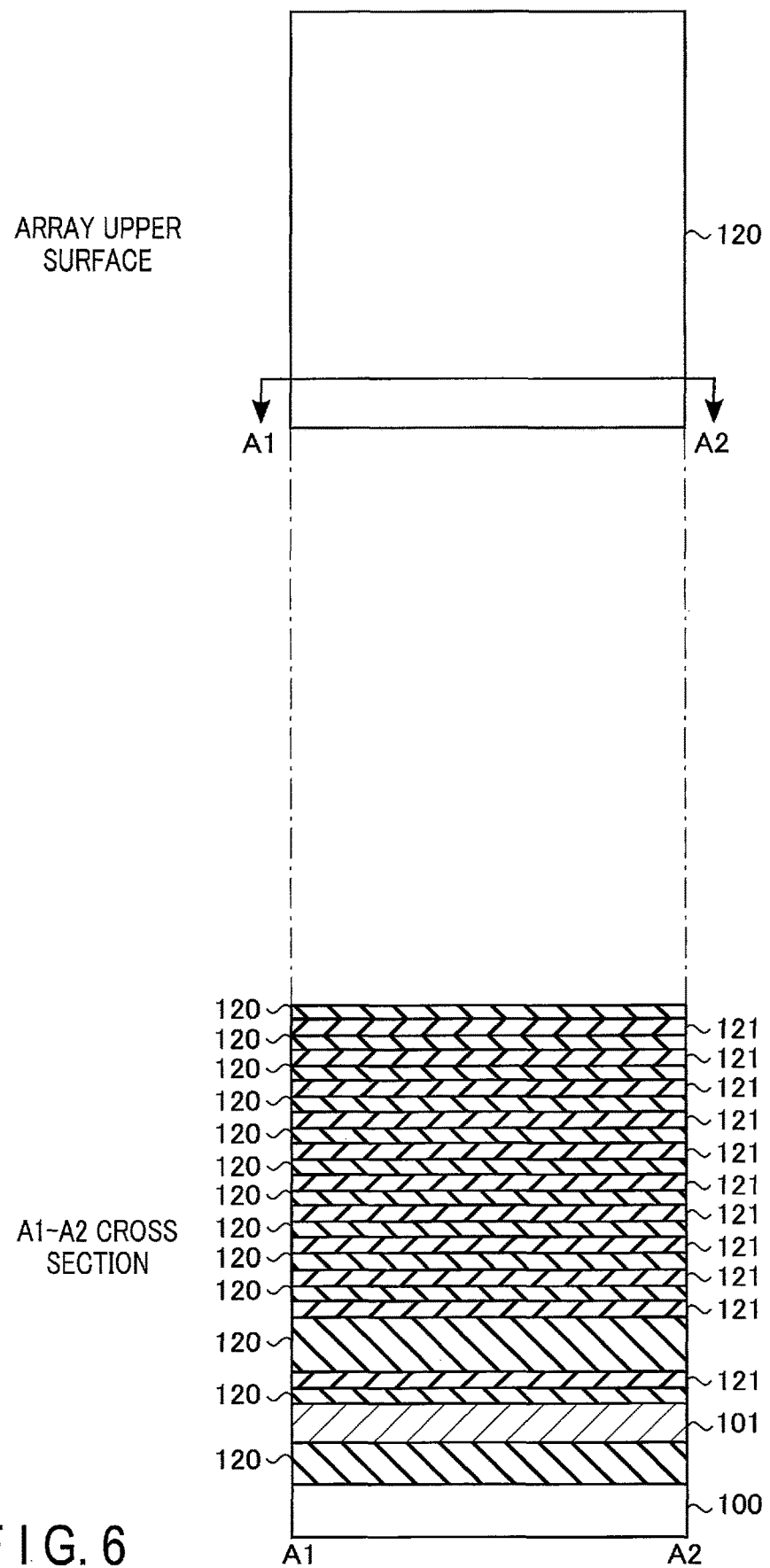
FIGS. 6 to 14 are diagrams illustrating manufacturing processes of a memory cell array provided in a semiconductor memory device according to the first embodiment.

As illustrated in FIG. 6, an insulating layer 120 is formed as an interlayer insulating film on the semiconductor substrate 100, and the interconnect layer 101 is formed thereon. Next, after forming the insulating layer 120 (e.g., SiO$_2$) on the interconnect layer 101, eleven sacrificial layers 121 corresponding to the three interconnect layers 102 and the eight interconnect layers 103, and eleven insulating layers 120 are stacked alternately.

Figure 7:
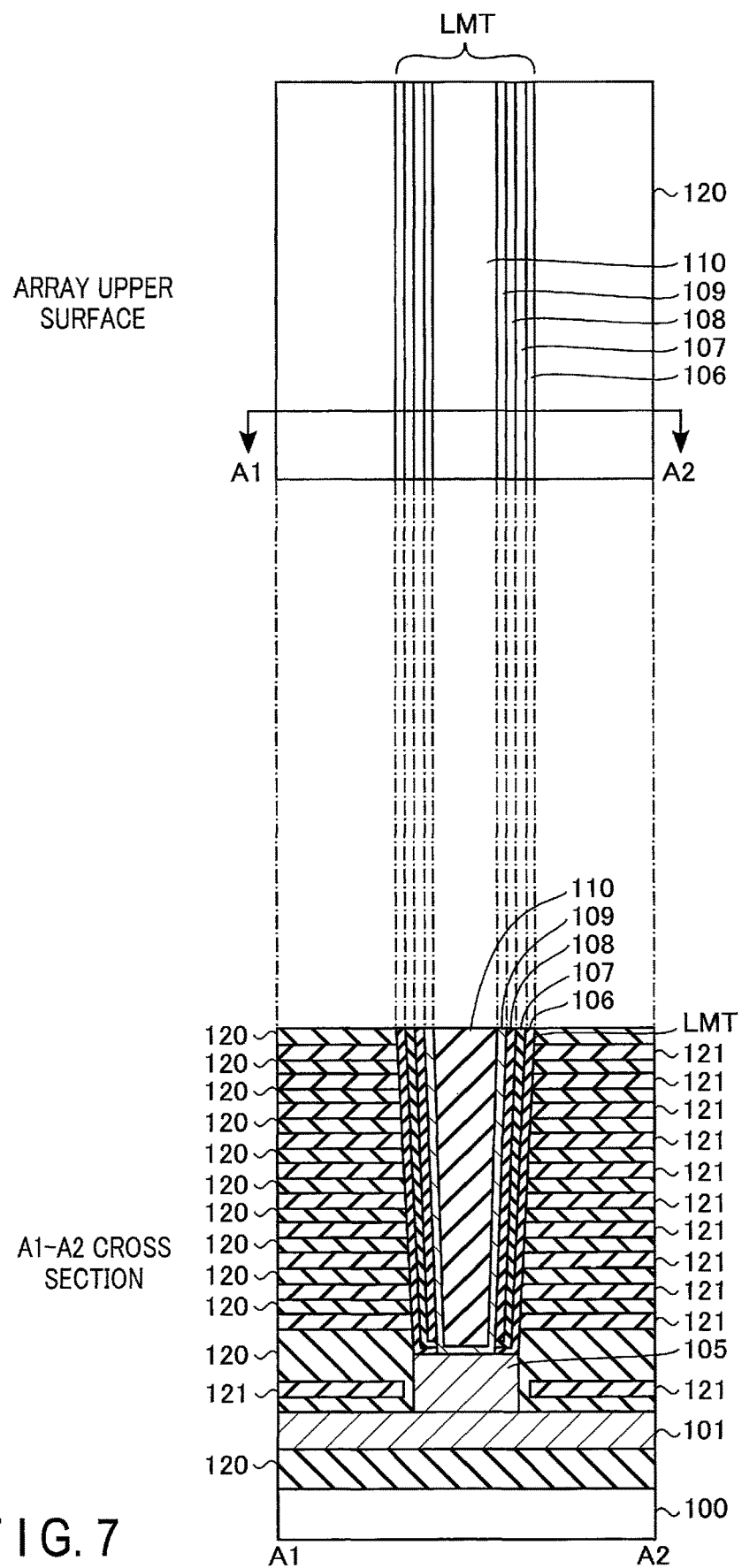

As illustrated in FIG. 7, the memory trench LMT is processed so that the bottom surface reaches the interconnect layer 101. Next, a thin film of the insulating layer 120 is formed on a side surface of the lowermost sacrificial layer 121 so that the side surface of the lowermost sacrificial layer 121 is not exposed in the memory trench LMT. Next, the semiconductor layer 105 is formed on the interconnect layer 101 exposed by epitaxial growth of Si. Next, the memory trench LMT is filled with the block insulating film 106, the charge storage layer 107, the tunnel insulating film 108, the semiconductor layer 109, and the core layer 110. More specifically, first, the block insulating film 106, the charge storage layer 107, and the tunnel insulating film 108 are formed, and the block insulating film 106, the charge storage layer 107, and the tunnel insulating film 108 on the uppermost insulating layer 120 and of the bottom surface of the memory trench LMT are removed by dry etching. Next, after forming the semiconductor layer 109 and the core layer 110 and filling the inside of the memory trench LMT, the surplus semiconductor layer 109 and the core layer 110 on the insulating layer 120 are removed.

Figure 8:
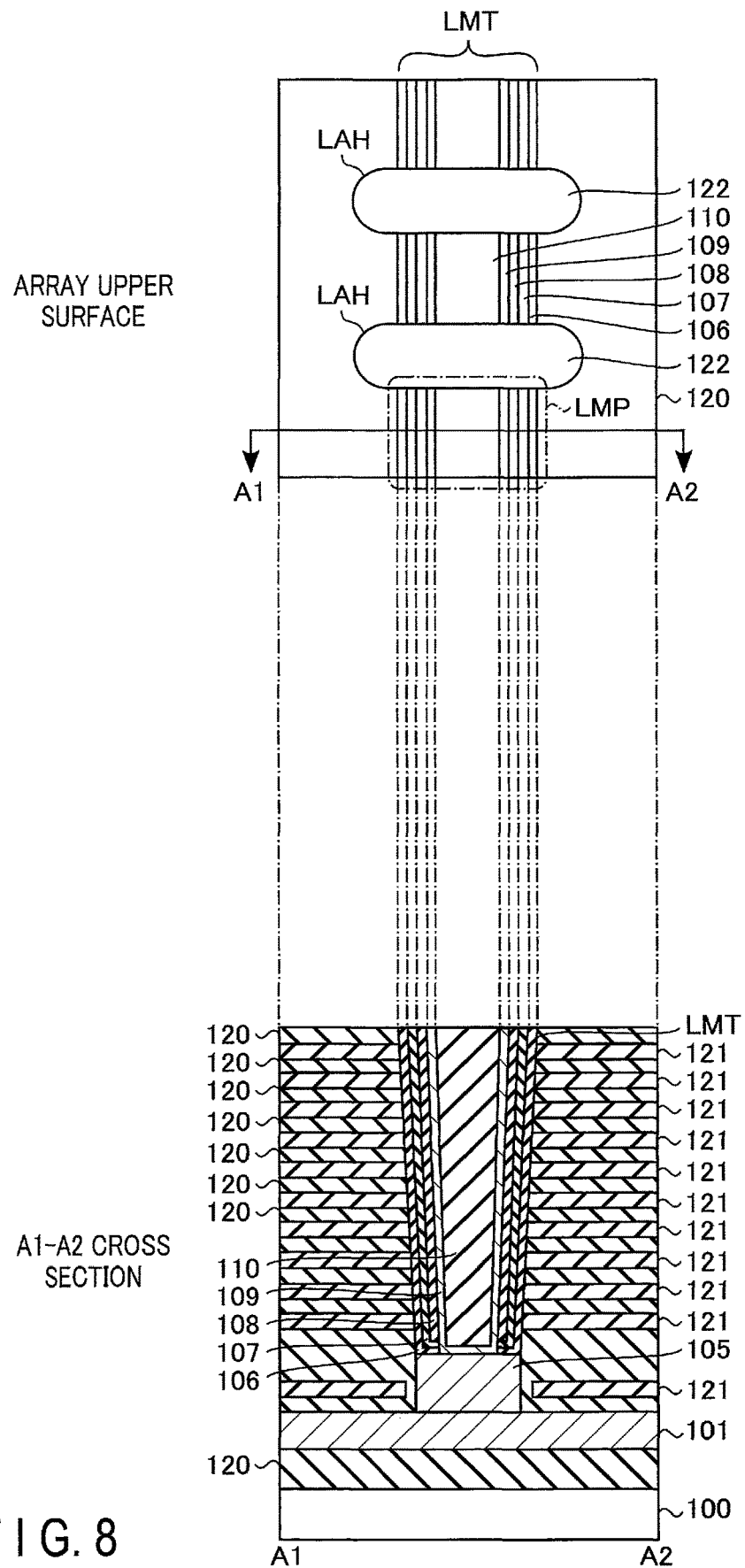

As illustrated in FIG. 8, after forming a hole LAH having a bottom surface partly reaching the semiconductor layer 105, the inside of the hole LAH is filled with an insulating layer 122 (e.g., S102). More specifically, after forming the insulating layer 122 and filling the inside of the hole LAH, the surface of the insulating layer 122 is flattened by, for example, dry etching or CMP (chemical mechanical polishing). This separates the memory trench LMT in the Y direction and forms the memory pillar LMP.

Figure 9:
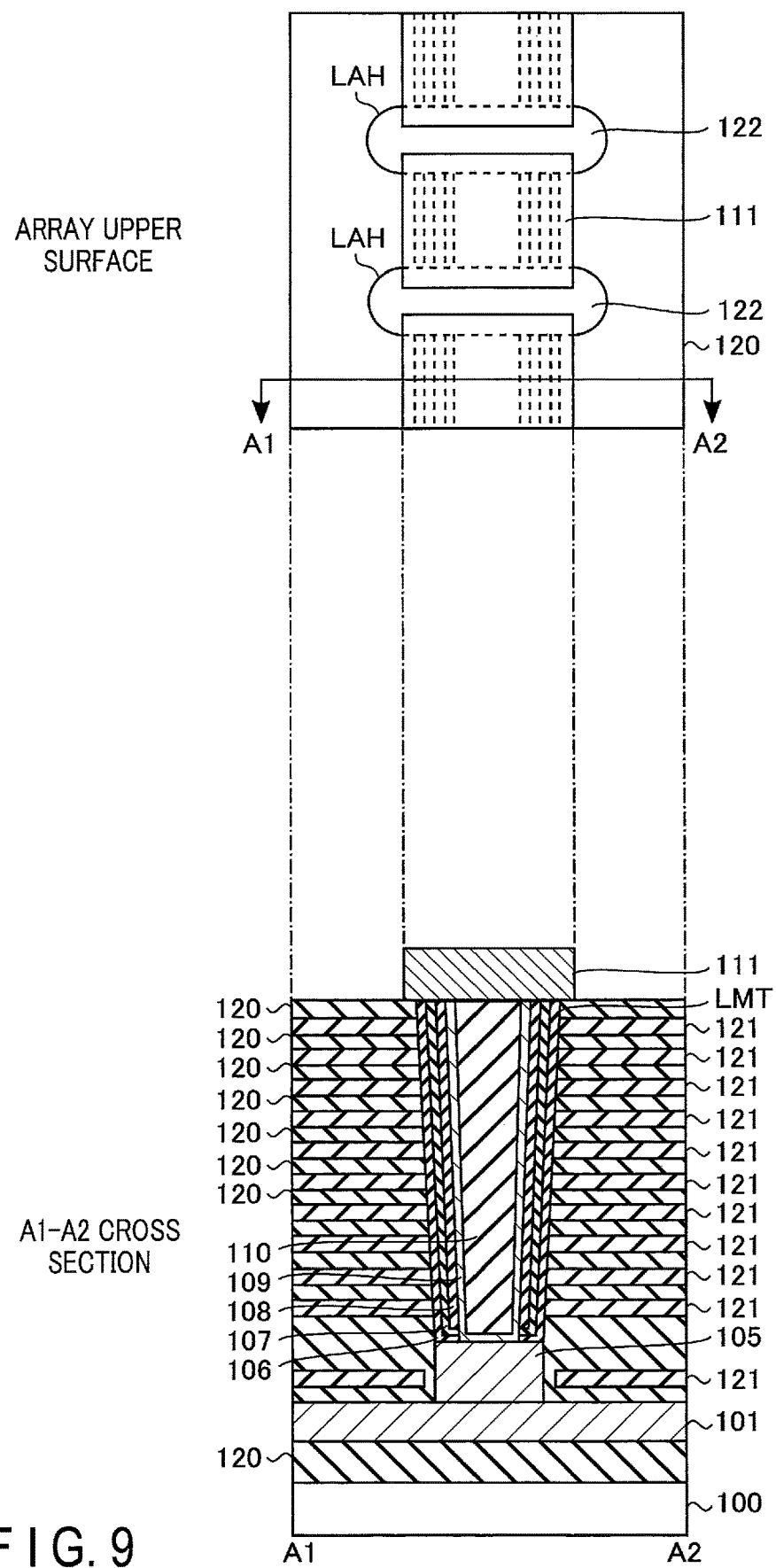

As illustrated in FIG. 9, a conductive layer 111 is formed on the memory pillar LMP. The conductive layer 111 functions as an etching stopper in processing the memory trench UMT. Therefore, the film thickness of the conductive layer 111 in the Z direction is set so that the conductive layer 111 is removed and the memory pillar LMP is not exposed in processing the memory trench UMT.

Figure 10:
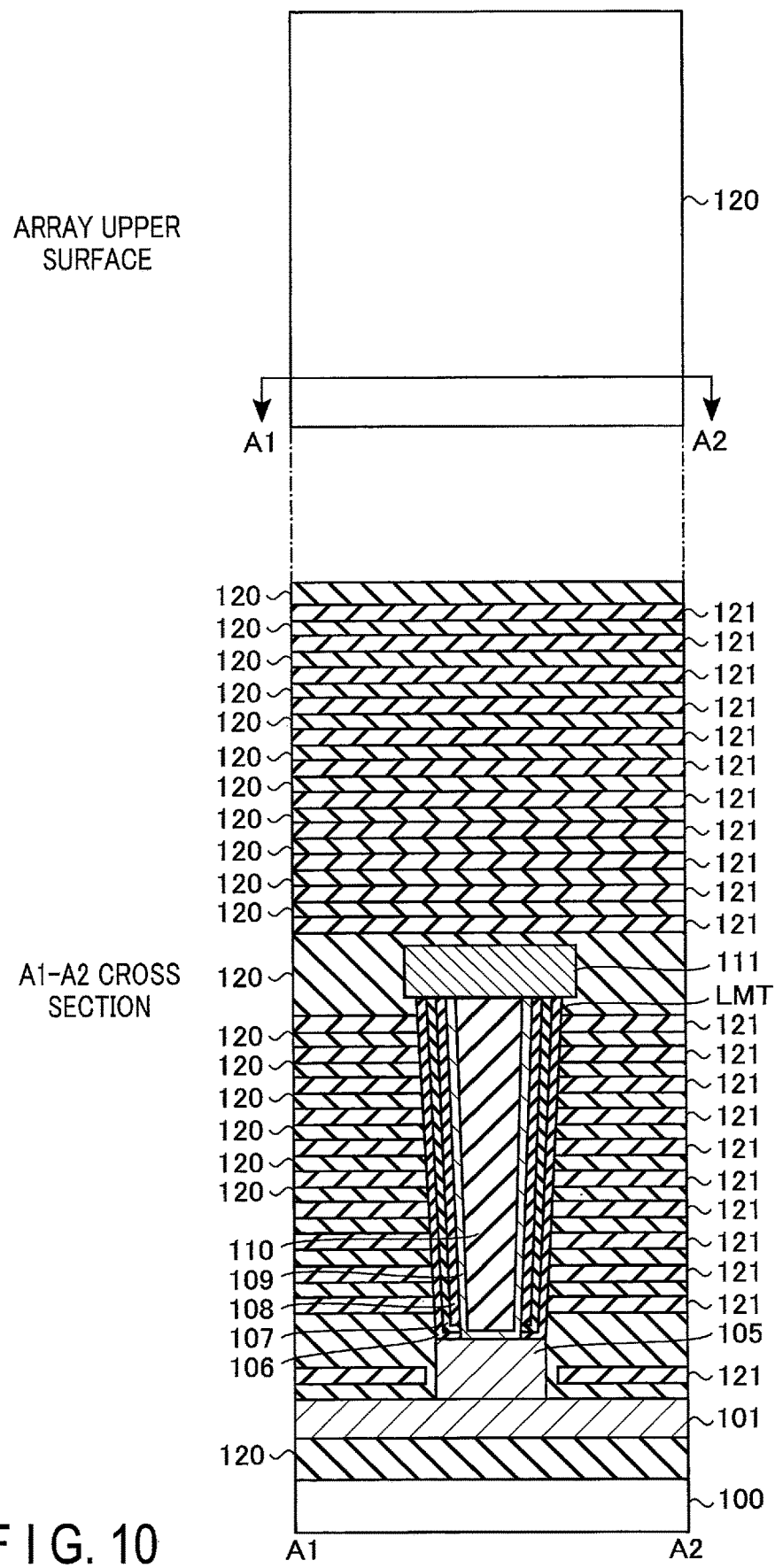

As illustrated in FIG. 10, after covering the conductive layer 111 with the insulating layer 120, eleven sacrificial layers 121 corresponding to the eight interconnect layers 103 and the three interconnect layers 104, and eleven insulating layers 120 are stacked alternately.

Figure 11:
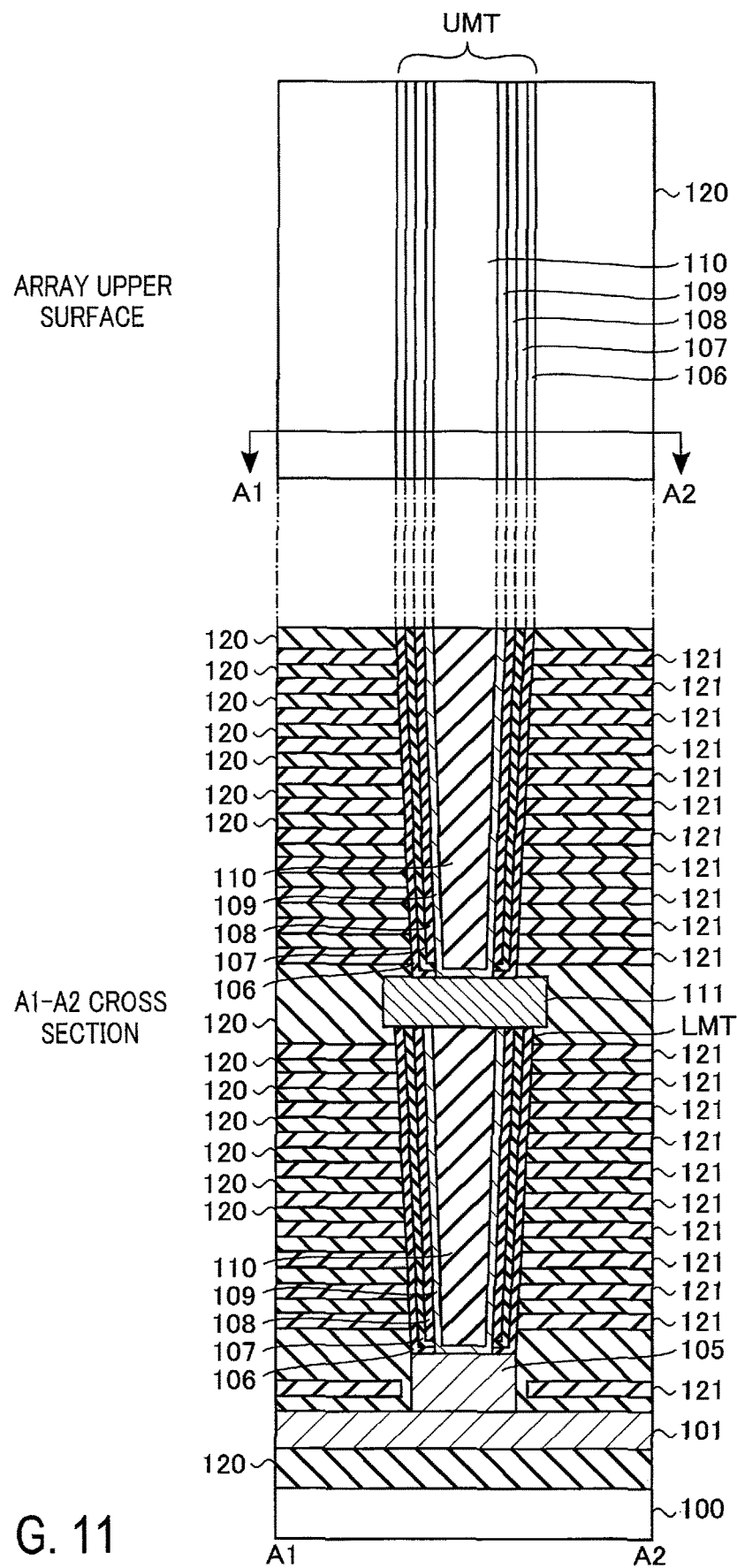

As illustrated in FIG. 11, a memory trench UMT having a bottom surface reaching the conductive layer 111 and the insulating layer 122 to fill the hole LAH is processed. Next, the memory trench UMT is filled with the block insulating film 106, the charge storage layer 107, the tunnel insulating film 108, the semiconductor layer 109, and the core layer 110 as with the memory trench LMT.

Figure 12:
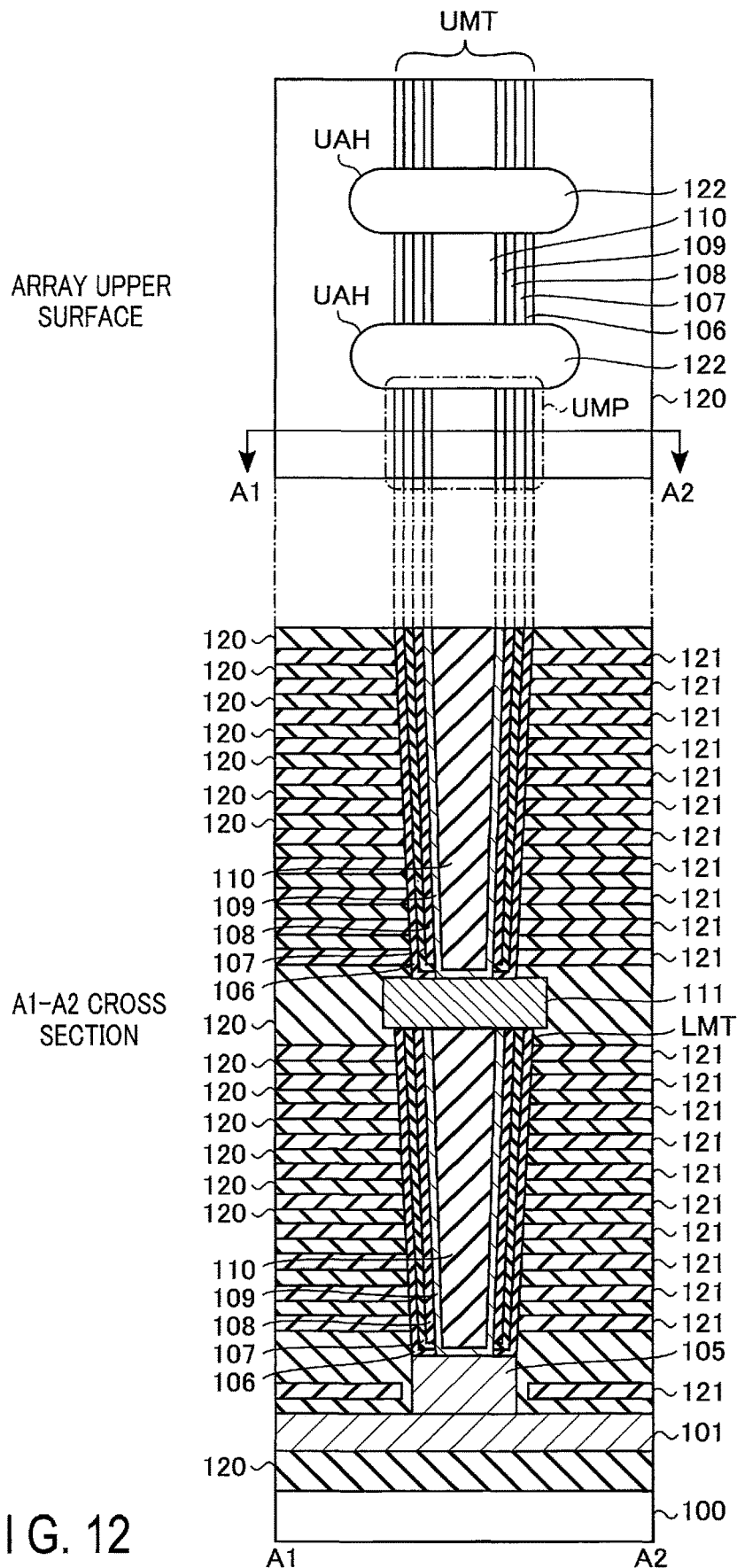

As illustrated in FIG. 12, after forming the hole UAH having a bottom surface partly reaching the conductive layer 111, the inside of the hole UAH is filled with the insulating layer 122. This separates the memory trench UMT in the Y direction and forms the memory pillar UMP.

Figure 13:
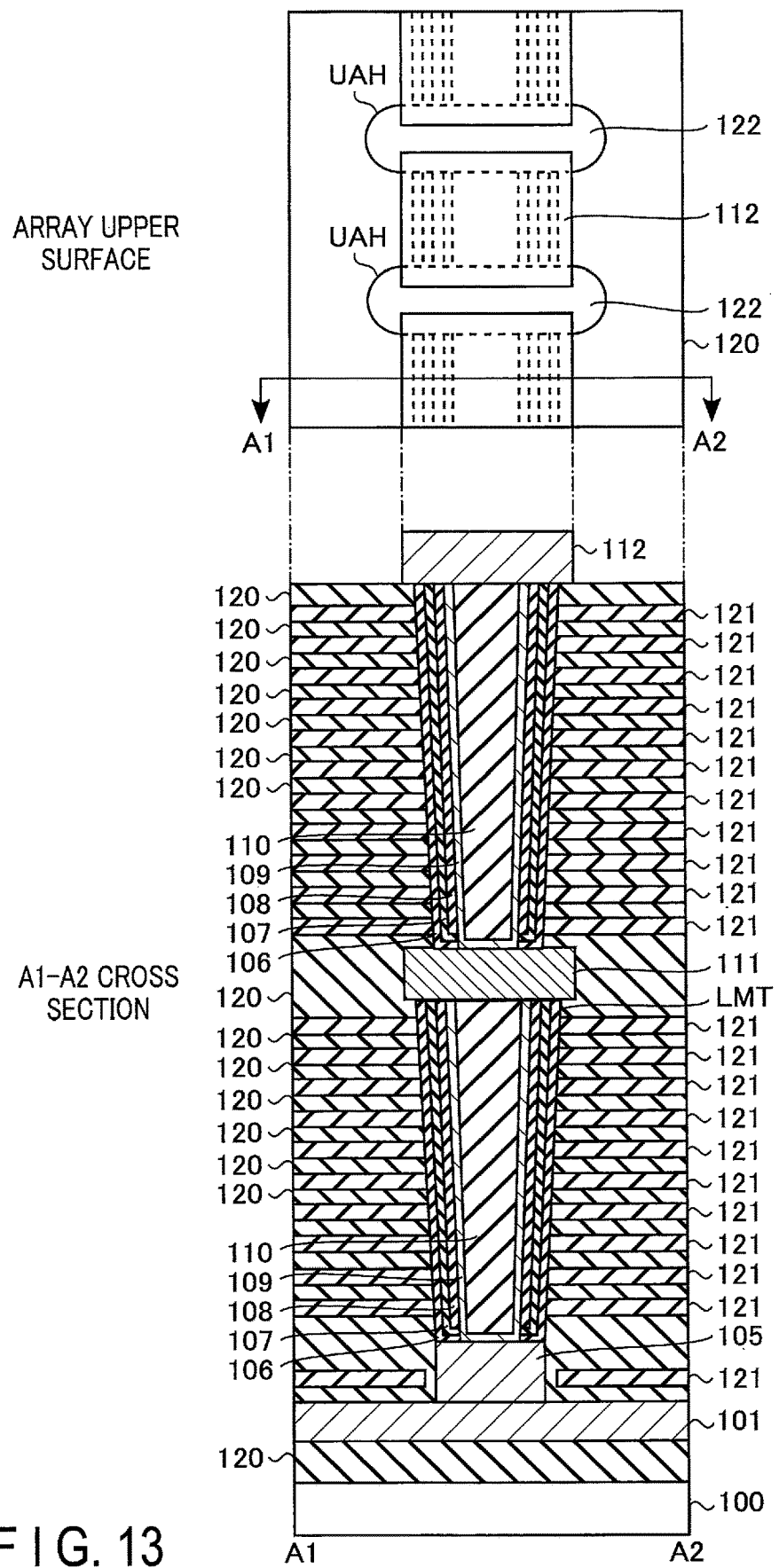

As illustrated FIG. 13, the conductive layer 112 is formed on the memory pillar UMP.

Figure 14:
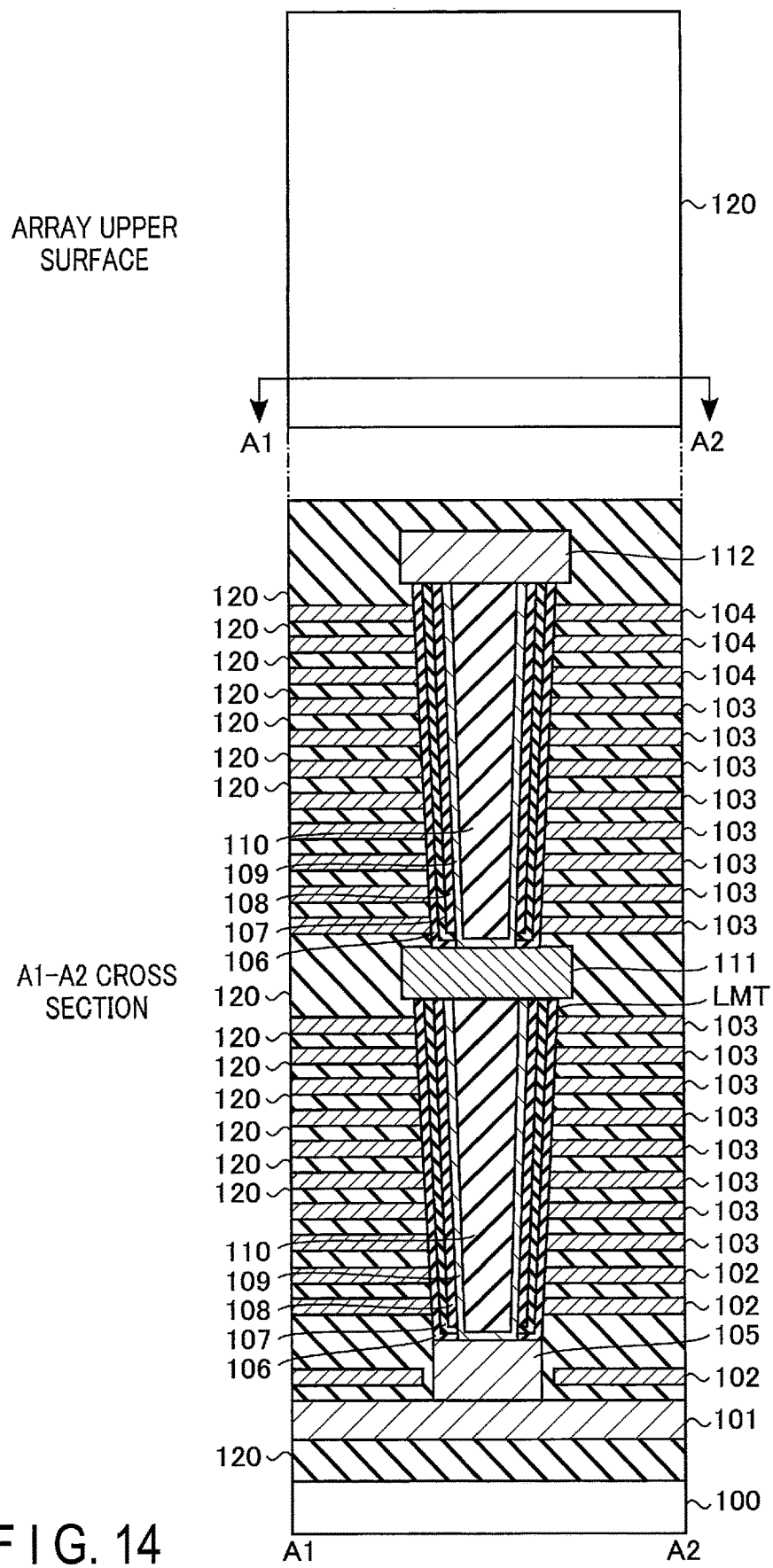

As illustrated in FIG. 14, after covering the conductive layer 112 with the insulating layer 120, backfilling is performed to form the interconnect layers 102, 103, and 104. More specifically, first, a slit or a hole (not shown) is formed so that a side surface of the sacrificial layer 121 is exposed. Next, wet etching using, for example, phosphoric acid ($H_3PO_4$) is performed. This etches the sacrificial layer 121 from the slit and forms a cavity. Next, TiN and W are formed in order so as to fill the cavity. Next, surplus W and TiN on the insulating layer 120 on a side surface and the surface of the slit are removed to form the interconnect layers 102, 103, and 104. Next, the slit is filled with an insulating layer, for example.

1.3 Reading Operation

Next, the read operation will be described with reference to FIG. 15. The example of FIG. 15 briefly illustrates an equivalent circuit of one memory group MG, and illustrates a case in which the memory cell transistor MC of the memory string UMSR is selected as a reading target.

Figure 15:
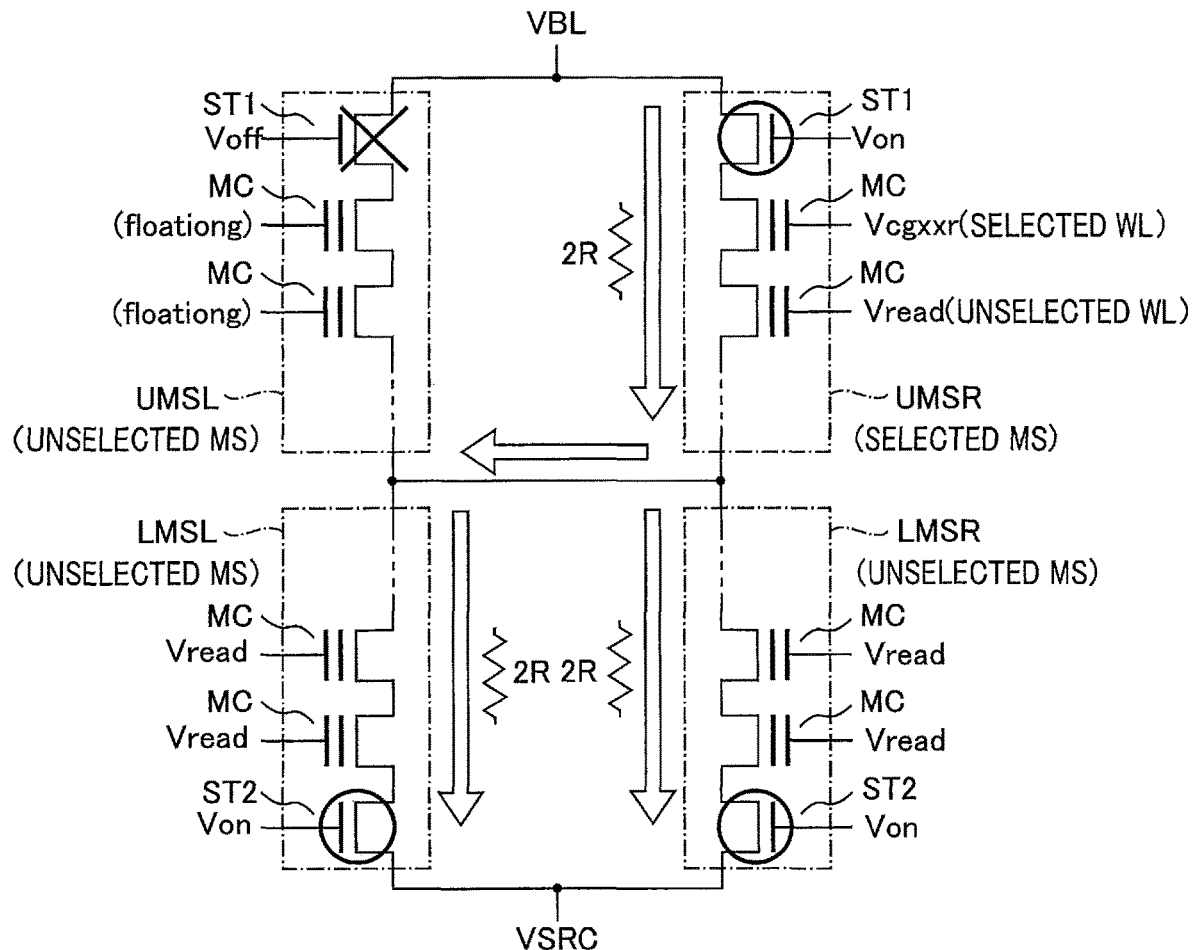
FIG. 15 is a diagram illustrating an example of voltage at respective interconnects at the time of read operation in a semiconductor memory device according to the first embodiment.

When the memory cell transistor MC of the memory string UMSR is selected, the row decoder 12 applies voltage Von to the selection gate line SGD corresponding to the memory string UMSR, and the selection transistors ST1 (STR1A, STR1B, and STR1C) of the memory string UMSR are turned on as illustrated in FIG. 15. The voltage Von is a voltage for turning on the selection transistors ST1 and ST2. Moreover, the row decoder 12 applies voltage Voff to the selection gate line SGD corresponding to an unselected memory string UMSL coupled in parallel to the memory string UMSR, and the selection transistors ST1 (STL1A, STL1B, and STL1C) of the memory string UMSL are turned off. The voltage Voff is a voltage for turning off the selection transistors ST1 and ST2 and is a voltage (e.g., ground voltage VSS) lower than the voltage Von. Furthermore, the row decoder 12 applies the voltage Von to the selection gate line SGS corresponding to unselected memory strings LMSL and LMSR, and the selection transistors ST2 (STL2A, STL2B, STL2C, STR2A, STR2B, and STR2C) of the memory strings LMSL and LMSR are turned on. When any one of the memory strings LMSL and LMSR is selected, for example, it is to be noted that the row decoder 12 turns on the selection transistor ST2 of the selected memory string LMS and the selection transistor ST1 of the unselected memory strings UMSL and UMSR, and turns off the selection transistor ST2 of the unselected memory string LMS.

Moreover, the row decoder 12 applies voltage Vcgxxr to a word line WL (hereinafter referred to as a selected word line WL) corresponding to the memory cell transistor MC selected, and applies voltage Vread to the word line WL (hereinafter referred to as an unselected word line WL) corresponding to an unselected memory cell transistor MC, in the memory string UMSR. The voltage Vcgxxr is a voltage corresponding to the reading level of the reading data. For example, the memory cell transistor MC is turned on when the threshold voltage of the selected memory cell transistor MC is lower than the voltage Vcgxxr, while the memory cell transistor MC is turned off when the threshold voltage is equal to or higher than the voltage Vcgxxr. The voltage Vread is a voltage for turning on the memory cell transistor MC regardless of the threshold voltage of the memory cell transistor MC. For example, the voltage Vcgxxr is a voltage lower than the voltage Vread and the voltage Von, and higher than the voltage Voff.

Moreover, the row decoder 12 puts unselected word lines WL (WLL8 to WLL15) corresponding to the memory string UMSL into a floating state. Furthermore, the row decoder 12 applies voltage Vread to the unselected word lines WL (WLL0 to WLL7 and WLR0 to WLR7) corresponding to the memory strings LMSL and LMSR. Accordingly, the memory cell transistors MC and the selection transistors ST2 of the memory strings LMSL and LMSR are turned on and function as a current path for letting current flow from the bit line BL to the source line SL, for example. When any one of the memory strings LMS is selected, for example, it is to be noted that the row decoder 12 applies voltage Vread to the selected memory string LMS and unselected word lines WL of the memory strings UMSL and UMSR, and puts unselected word lines WL of unselected memory strings LMS into a floating state.

In such a state, the sense amplifier 13 applies voltage VBL to the bit line BL corresponding to the memory cell transistor MC to be read. Moreover, voltage VSRC is applied to the source line SL. The voltage VBL and the voltage VSRC have a relation of VBL>VSRC.

When the selected memory cell transistor MC is in the ON state, current flows from the bit line BL to the source line SL via the memory strings UMSR, LMSL, and LMSR. Accordingly, when the resistance value of a case in which one memory string MS functions as a current path is 2R, the combined resistance value in one memory group MG becomes 3R. On the other hand, when the selected memory cell transistor MC is in the OFF state, no current flows from the bit line BL to the source line SL. The sense amplifier 13 senses the current flowing from the bit line BL to the source line SL, for example, and reads data of the memory cell transistor MC.

1.4 Advantageous Effects of Present Embodiment

It is possible with the structure according to the present embodiment to improve reliability. The effect will be described in detail.

In a case in which the semiconductor layers 109 of two memory cell transistors MCL and MCR formed in the same layer are not separated, that is, in a case in which the channels are common in one memory pillar MP, current may possibly flow to a channel outside the memory cell region at the time of read operation, causing erroneous reading.

On the other hand, it is possible with the structure according to the present embodiment to separate semiconductor layers 109, that is, channels of two memory cell transistors MCL and MCR formed in the same layer in one memory pillar MP. This lets current to flow to a channel outside the memory cell region, and it is possible to suppress the possibility of occurrence of erroneous reading. Accordingly, the reliability of the semiconductor memory device can be improved.

Furthermore, it is possible with the structure according to the present embodiment to provide the conductive layer 111 between the memory pillar LMP and the memory pillar UMP. Processing damage to the memory pillar LMP can be suppressed by utilizing the conductive layer 111 as an etching stopper in processing the memory trench UMT. This makes it possible to suppress deterioration of the shape and electric characteristics of the memory pillar LMP even when the memory pillar UMP and the memory pillar LMP are stacked. Accordingly, the reliability of the semiconductor memory device can be improved.

Furthermore, it is possible with the structure according to the present embodiment to set the distance between conductive layers 111 formed on memory pillars LMP adjacent to each other with the hole LAH interposed therebetween equal to or less than a thickness of twice the width (film thickness) of the block insulating film 106, the charge storage layer 107, and the tunnel insulating film 108 in the X direction. This makes it possible to fill a processing region in the hole LAH with the block insulating film 106, the charge storage layer 107, and the tunnel insulating film 108 in filling the inside of the memory trench UMT even when the insulating layer 122 in the hole LAH between the conductive layers 111 is processed in processing the memory trench UMT. It is therefore possible to suppress the semiconductor layer 109 from entering the hole LAH. Accordingly, occurrence of leakage at the memory pillar LMP due to the semiconductor layer 109 remaining in the hole LAH, and formation of a floating potential affecting the cell operation can be suppressed.

Furthermore, it is possible with the structure according to the present embodiment to let cell current flow via two memory strings MS of unselected memory pillars MP coupled to the memory pillar MP to be read at the time of read operation. This makes it possible to suppress increase in the resistance value in the memory group MG and to suppress decrease in cell current. Hence, erroneous reading in the read operation can be suppressed.

2. Second Embodiment

Next, a second embodiment will be described. In the second embodiment, the shape of a memory pillar MP different from that of the first embodiment will be described. The following description will explain only differences from the first embodiment.

2.1 Sectional Structure of Memory Cell Array

Figure 16:
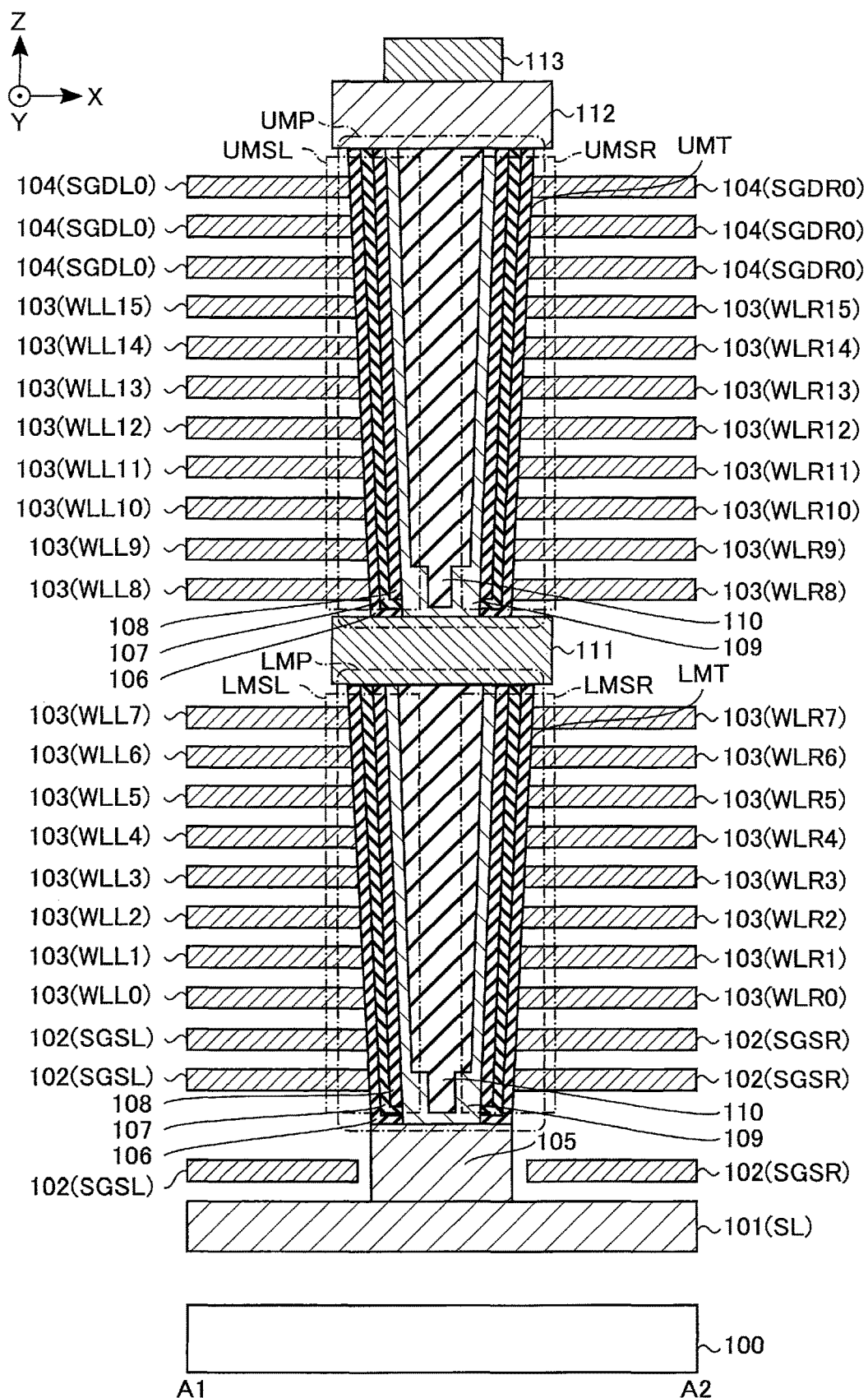
FIG. 16 is a sectional view of a memory cell array provided in a semiconductor memory device according to a second embodiment.
Figure 17:
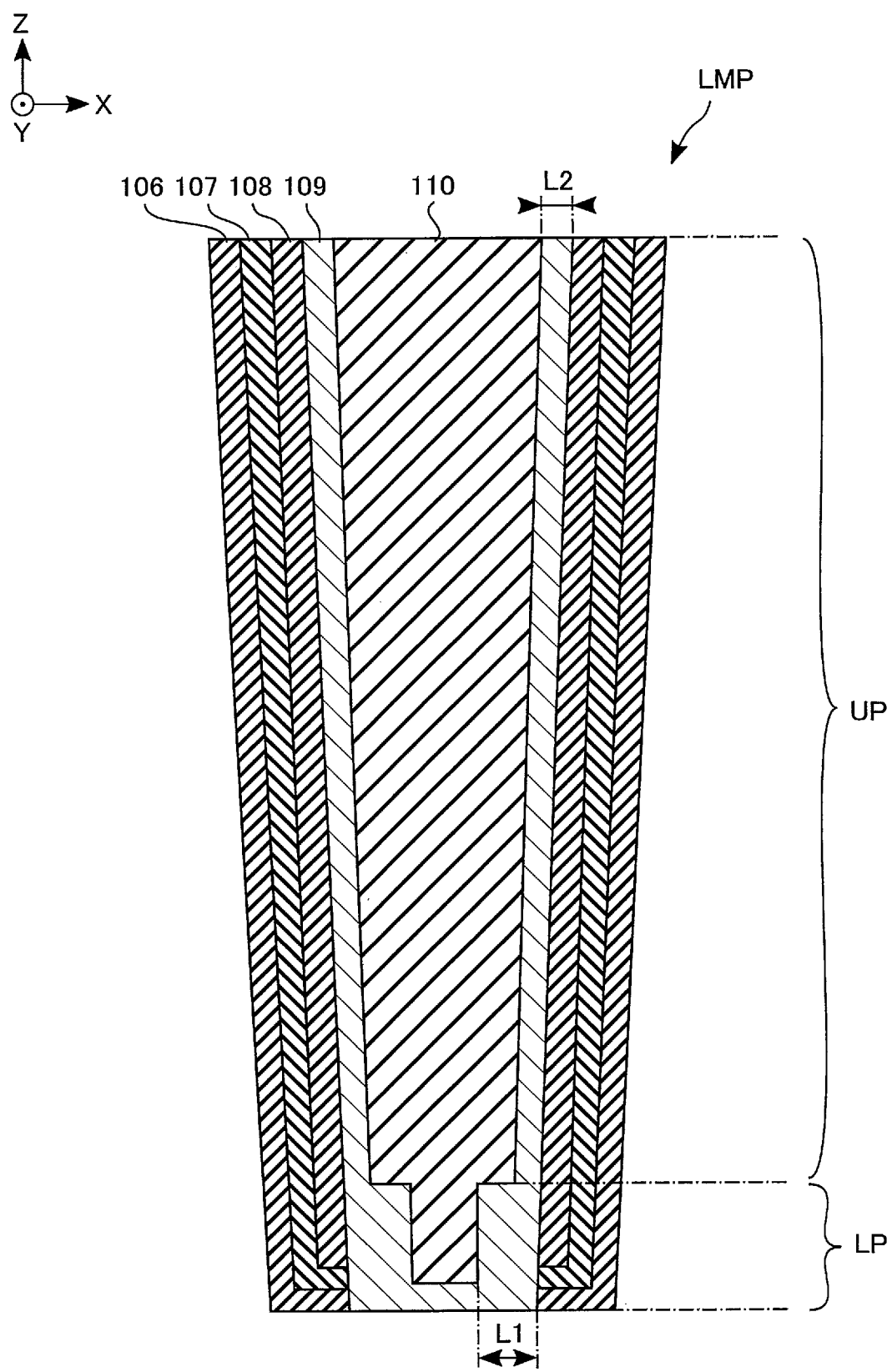
FIG. 17 is a sectional view of a memory pillar LMP in a memory cell array provided in a semiconductor memory device according to the second embodiment.

Next, the sectional structure of a memory cell array 11 will be described with reference to FIGS. 16 and 17. FIG. 16 is a sectional view of the memory cell array 11. FIG. 17 is an enlarged view of a memory pillar LMP. It is to be noted that interlayer insulating films are omitted in FIG. 16. Moreover, FIG. 17 illustrates a memory pillar LMP, which is similar to a memory pillar UMP.

As illustrated in FIG. 16, in the present embodiment, the film thickness of a semiconductor layer 109 in the X direction (i.e., the radial direction of the memory pillar MP) is larger in the vicinity of the bottom portion of a memory pillar MP than in the upper end portion of the memory pillar MP. The other structure is the same as that in FIG. 5 of the first embodiment.

As illustrated in FIG. 17, more specifically, the memory pillar LMP roughly includes a pillar upper portion UP including the upper end of the memory pillar LMP, and a pillar lower portion LP including the lower end of the memory pillar LMP. Assuming that the film thickness in the X direction of the semiconductor layer 109 on a side surface of the pillar lower portion LP is L1 and the film thickness in the X direction of the semiconductor layer 109 on a side surface of the pillar upper portion UP is L2, the relationship is L1>L2.

2.2 Manufacturing Method of Memory Cell Array

Next, a method of manufacturing the memory cell array 11 will be briefly described.

In the present embodiment, first, a block insulating film 106, a charge storage layer 107, a tunnel insulating film 108, a semiconductor layer 109, and a cover insulating layer are formed in filling the inside of the memory trench LMT (or UMT). The cover insulating layer is provided for protecting the surface of the semiconductor layer 109, and $SiO_2$, for example, is used. Next, the block insulating film 106, the charge storage layer 107, the tunnel insulating film 108, the semiconductor layer 109, and the cover insulating layer on an uppermost insulating layer 120 and on the bottom surface of a memory trench LMT (or UMT) are removed by dry etching. Next, the cover insulating layer is removed by, for example, wet etching. Next, the semiconductor layer 109 and the core layer 110 are formed, and the inside of the memory trench LMT is filled. The subsequent steps are the same as those of the first embodiment. This makes the film thickness in the X direction of the semiconductor layer 109 of the pillar lower portion LP larger than the film thickness in the X direction of the semiconductor layer 109 of the pillar upper portion UP.

2.3 Advantageous Effects of Present Embodiment

It is possible with the structure according to the present embodiment to obtain effects similar to those of the first embodiment.

3. Third Embodiment

Next, a third embodiment will be described. In the third embodiment, a case in which memory pillars LMP and UMP are formed in holes LAH and UAH will be described. The following description will explain only differences from the first and second embodiments.

3.1 Planar Structure of Memory Cell Array

Figure 18:
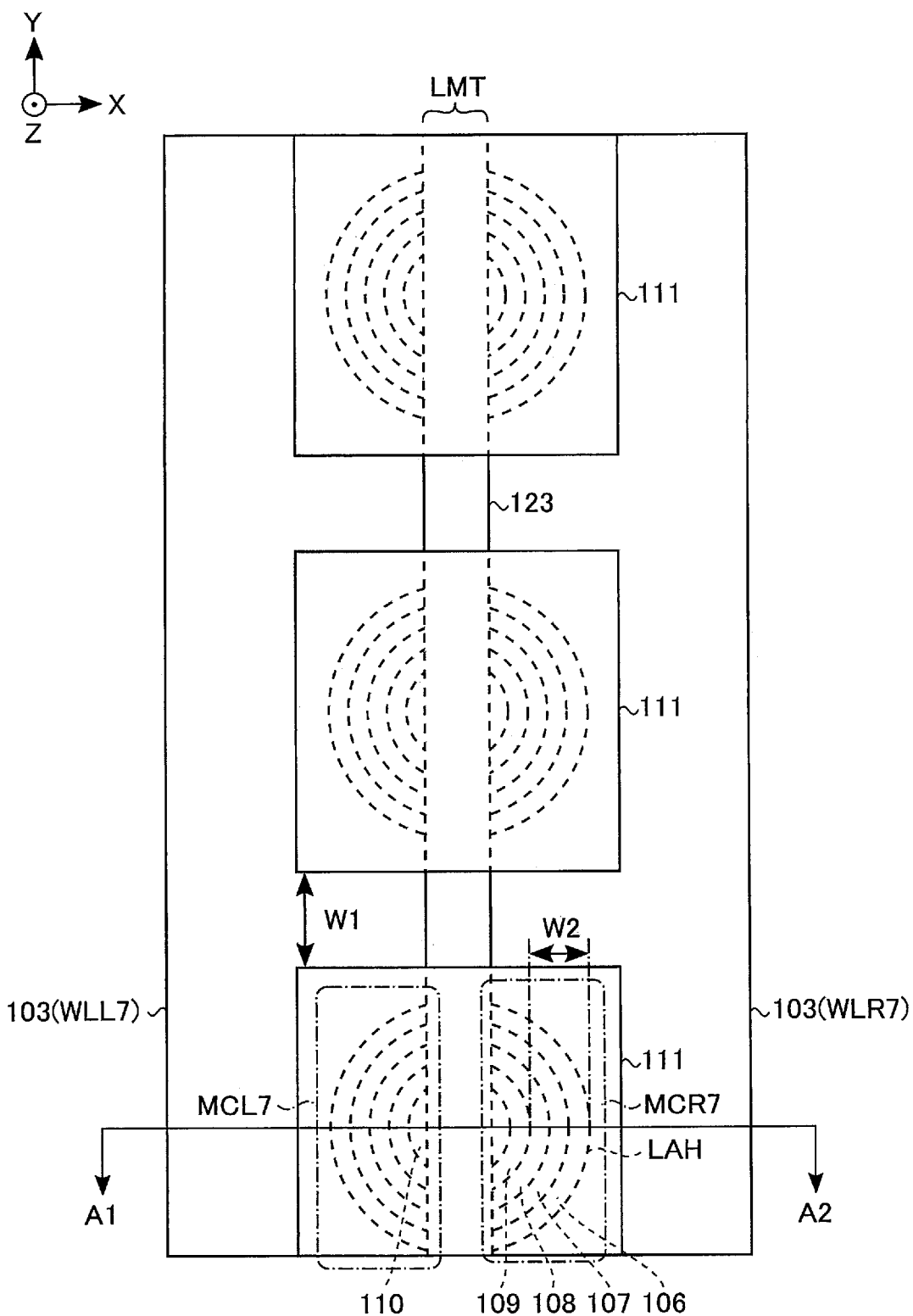
FIG. 18 is a plan view of a conductive layer 111 in a memory cell array provided in a semiconductor memory device according to a third embodiment.

First, the planar structure of a memory cell array 11 will be described with reference to FIG. 18. FIG. 18 illustrates the plane of the conductive layer 111 in the XY plane parallel to the semiconductor substrate 100. It is to be noted that interlayer insulating films are omitted in the example of FIG. 18.

As illustrated in FIG. 18, a word line WLL7 (interconnect layer 103) and a word line WLR7 (interconnect layer 103) extending in the Y direction are arranged adjacent to each other in the X direction. Between the word lines WLL7 and WLR7, a plurality of holes LAH is formed along the Y direction. In each hole LAH, a memory pillar LMP including a block insulating film 106, a charge storage layer 107, a tunnel insulating film 108, a semiconductor layer 109, and a core layer 110 is formed.

The word lines WLL7 and WLR7 are spaced apart in the X direction by a memory trench LMT formed along the Y direction. In the present embodiment, the inside of the memory trench LMT is filled with an insulating layer 123. Moreover, the memory pillar LMP is separated into two for the left region and the right region in the X direction by the memory trench LMT. In the example of FIG. 18, a memory cell transistor MCL7 is formed of a region including the word line WLL7 and the left region of the memory pillar LMP, and a memory cell transistor MCR7 is formed of a region including the word line WLR7 and the right region of the memory pillar LMP.

The length (width) of the memory trench LMT in the X direction is shorter than the inner diameter of the semiconductor layer 109 in the X direction so that the semiconductor layer 109 forming a channel of a memory cell transistor MC is not removed.

On the memory pillar LMP, a conductive layer 111 is provided so as to cover the upper surface of the memory pillar LMP. The lengths of the conductive layer 111 in the X direction and the Y direction are longer than the diameter of the memory pillar LMP.

As with FIG. 4 of the first embodiment, the distance W1 between two conductive layers 111 arranged along the Y direction, and the width (film thickness) W2 of the block insulating film 106, the charge storage layer 107, and the tunnel insulating film 108 in the X direction preferably have a relation of $W1 \leq 2 \times W2$.

3.2 Sectional Structure of Memory Cell Array

Next, the sectional structure of the memory cell array 11 will be described with reference to FIG. 19. FIG. 19 is a sectional view of the memory cell array 11. It is to be noted that interlayer insulating films are omitted in FIG. 19.

As illustrated in FIG. 19, a hole LAH is formed on a semiconductor layer 105. The inside of the hole LAH is filled with the block insulating film 106, the charge storage layer 107, the tunnel insulating film 108, the semiconductor layer 109, and the core layer 110, and a memory pillar LMP is formed. In addition, a memory trench LMT having a bottom surface reaching the semiconductor layer 105 is formed so as to separate the memory pillar LMP into two in the X direction. The inside of the memory trench LMT is filled with an insulating layer 123. $SiO_2$, for example, is used for the insulating layer 123.

A conductive layer 111 is formed on the memory pillar LMP. A hole UAH is formed on the conductive layer 111. The inside of the hole UAH is filled with the block insulating film 106, the charge storage layer 107, the tunnel insulating film 108, the semiconductor layer 109, and the core layer 110, and a memory pillar UMP is formed. In addition, a memory trench UMT having a bottom surface reaching the semiconductor layer 105 is formed so as to separate the memory pillar UMP into two in the X direction. The inside of the memory trench UMT is filled with an insulating layer 123.

It is to be noted that three or more stages of the memory pillars MP may be stacked. In such a case, a conductive layer 111 is provided between the respective memory pillars MP.

3.3 Manufacturing Method of Memory Cell Array

Next, a method of manufacturing the memory cell array 11 will be described with reference to FIGS. 20 to 27. FIGS. 20 to 27 respectively illustrate the array upper surface and the A1-A2 cross section in manufacturing processes.

Figure 20:
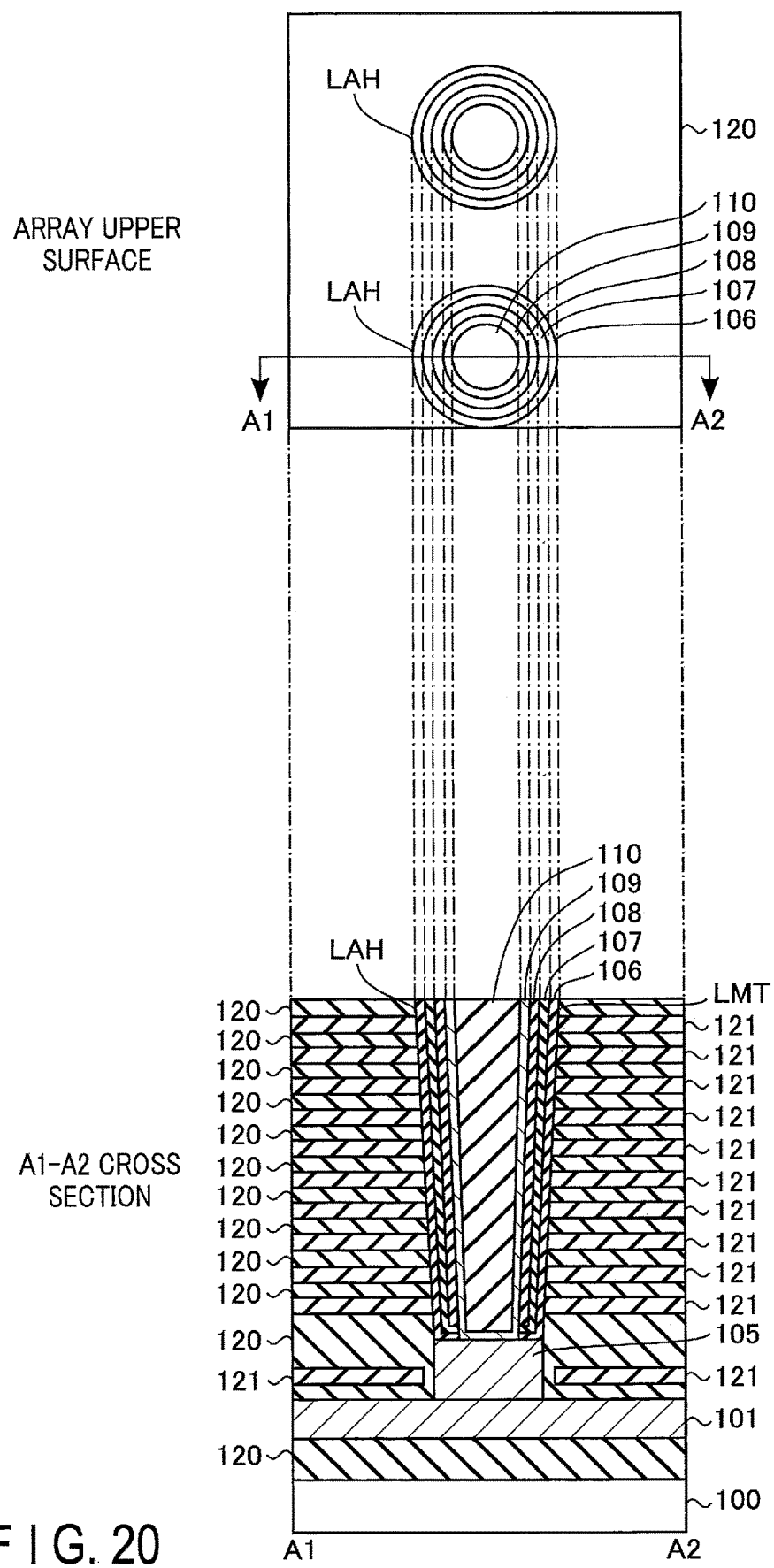
FIGS. 20 to 27 are diagrams illustrating manufacturing processes of a memory cell array provided in a semiconductor memory device according to the third embodiment.

As illustrated in FIG. 20, after forming a stacked structure of sacrificial layers 121 and insulating layers 120 described in FIG. 6 of the first embodiment, the hole LAH is processed so that the bottom surface reaches an interconnect layer 101. Next, a thin film of the insulating layer 120 is formed on a side surface of the lowermost sacrificial layer 121 so that the side surface of the lowermost sacrificial layer 121 is not exposed in the hole LAH. Next, the semiconductor layer 105 is formed on the interconnect layer 101 exposed by selective CVD of Si. Next, the hole LAH is filled with the block insulating film 106, the charge storage layer 107, the tunnel insulating film 108, the semiconductor layer 109, and the core layer 110. More specifically, first, the block insulating film 106, the charge storage layer 107, and the tunnel insulating film 108 are formed, and the uppermost insulating layer 120, and the block insulating film 106, the charge storage layer 107, and the tunnel insulating film 108 on the bottom surface of the hole LAH are removed. Next, after forming the semiconductor layer 109 and the core layer 110 and filling the inside of the memory trench LMT, the surplus semiconductor layer 109 and the core layer 110 on the insulating layer 120 are removed.

Figure 21:
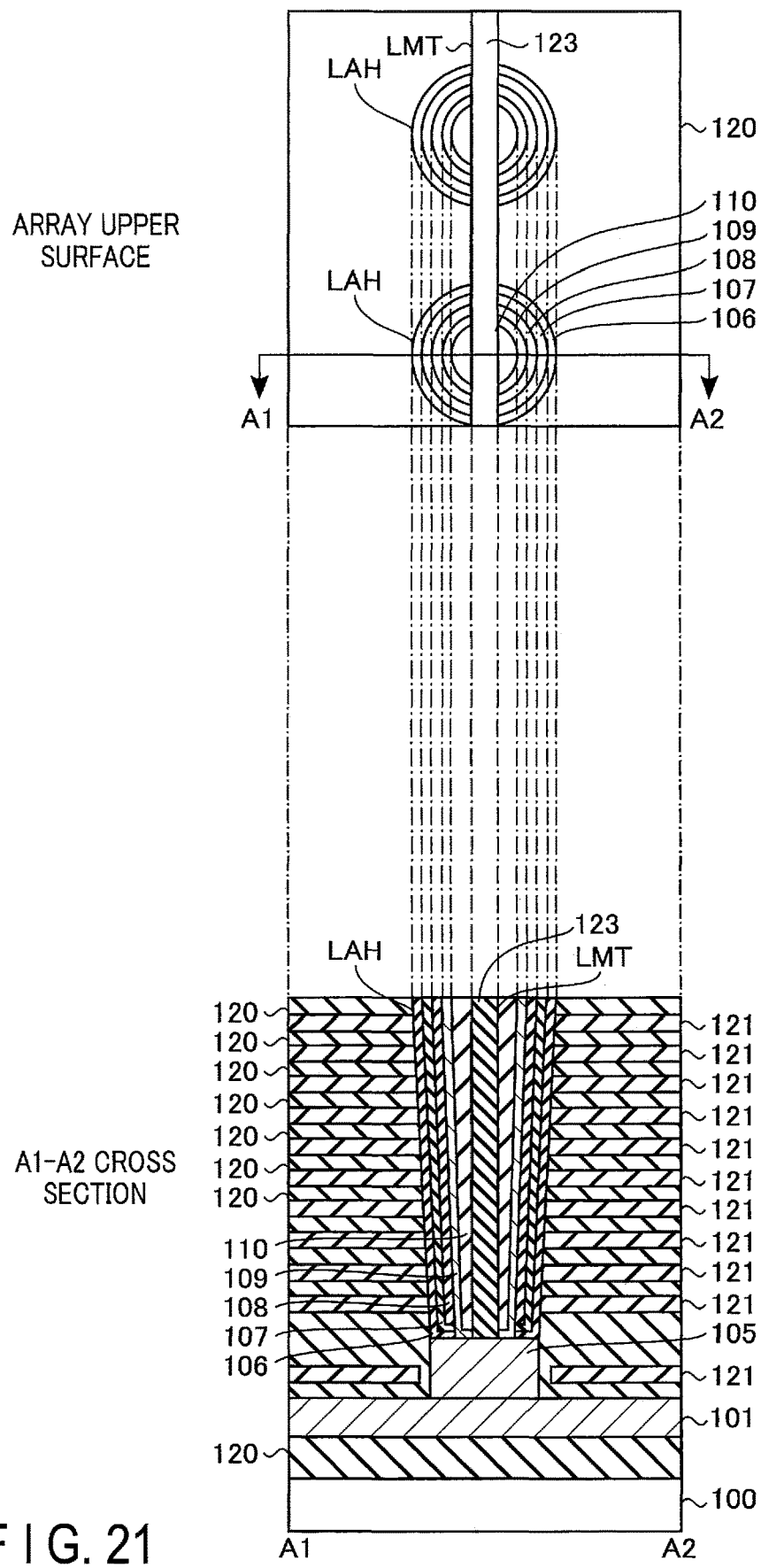

As illustrated in FIG. 21, after forming the memory trench LMT having a bottom surface reaching the semiconductor layer 105, the inside of the memory trench LMT is filled with the insulating layer 123. This separates the memory pillar LMP into two in the X direction.

Figure 22:
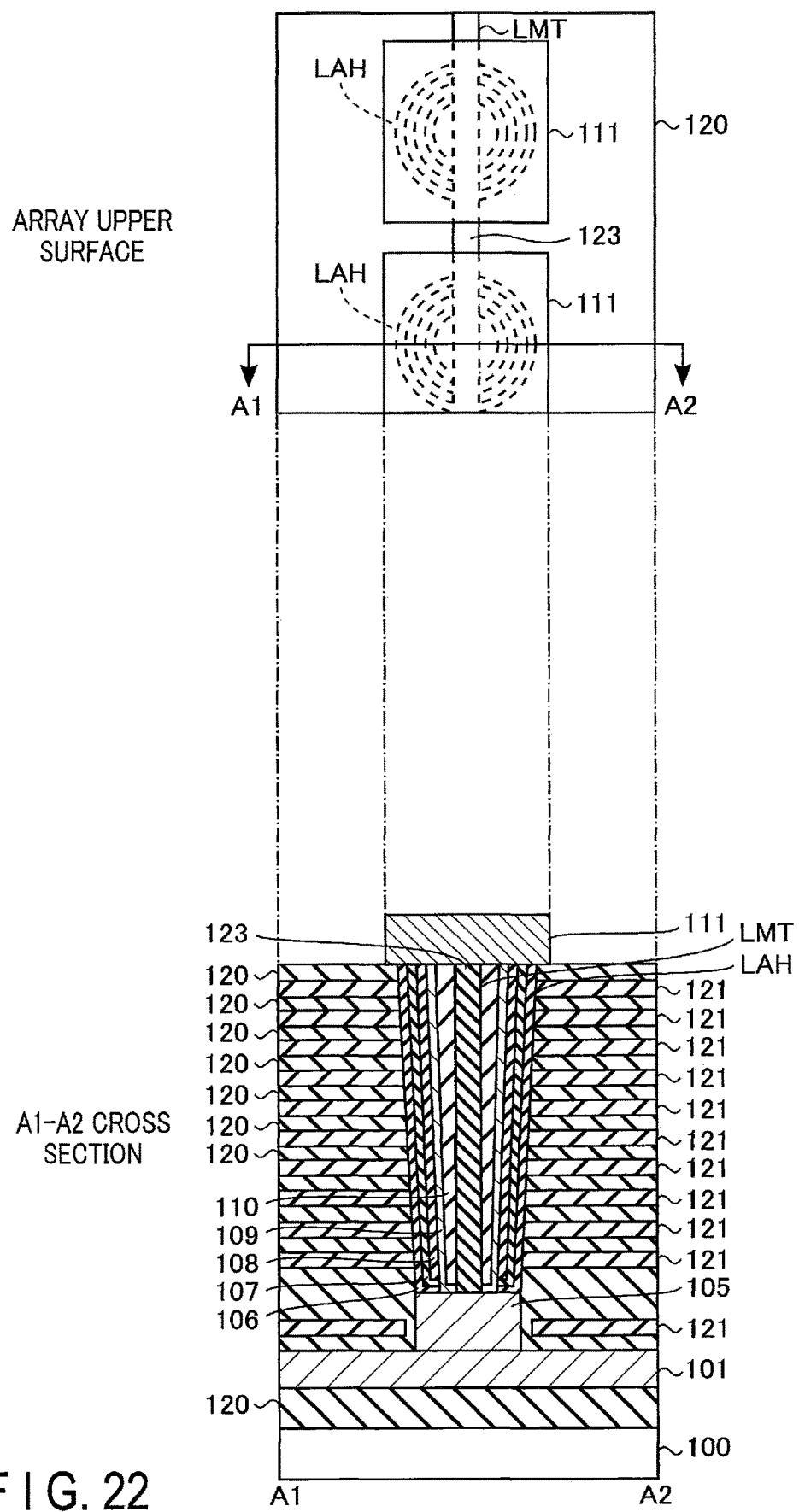

As illustrated in FIG. 22, a conductive layer 111 is formed on the memory pillar LMP as with FIG. 9 of the first embodiment.

Figure 23:
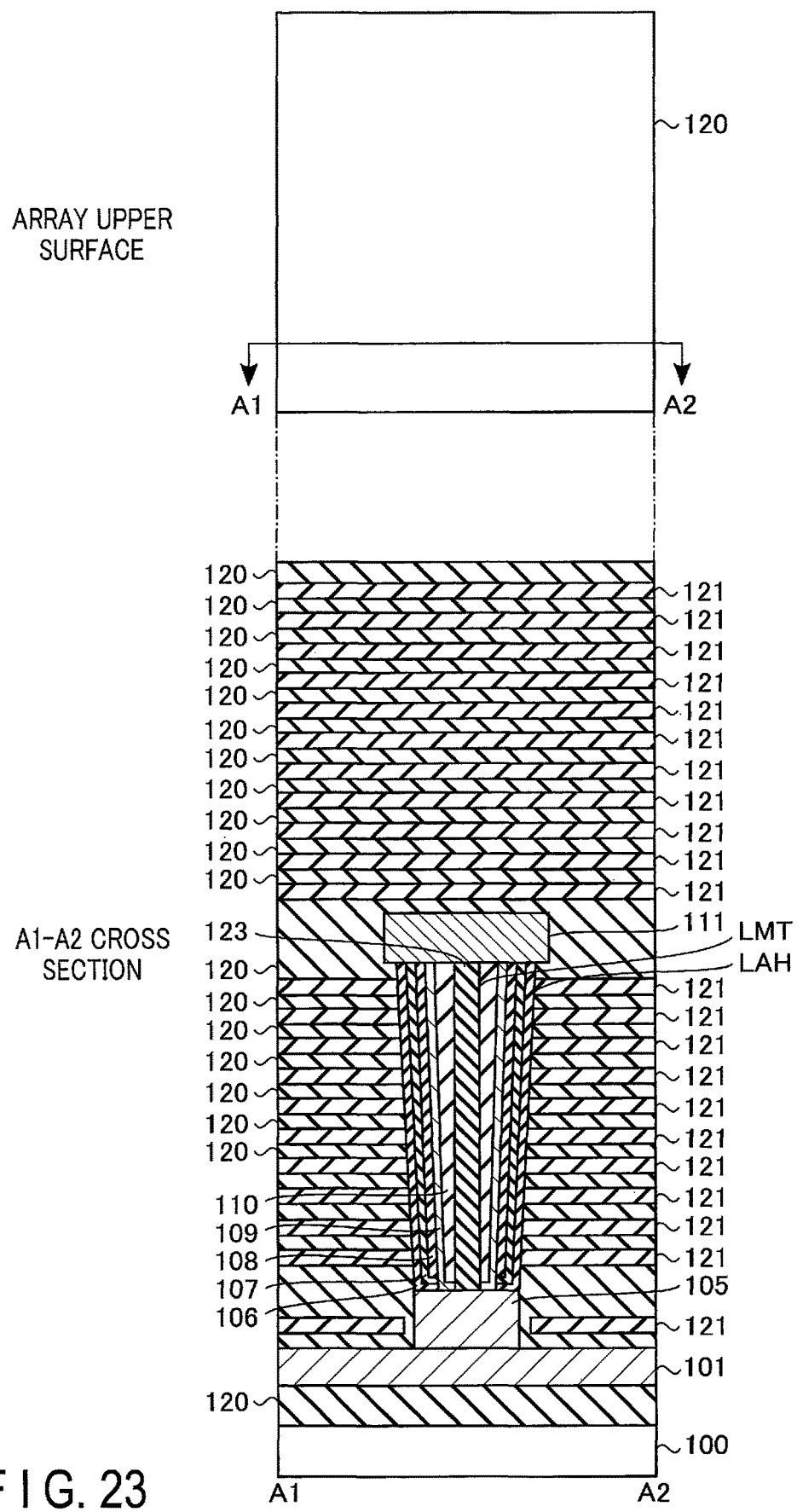

As illustrated in FIG. 23, after covering the conductive layer ill with the insulating layer 120, eleven sacrificial layers 121 corresponding to eight interconnect layers 103 and three interconnect layers 104, and eleven insulating layers 120 are stacked alternately.

Figure 24:
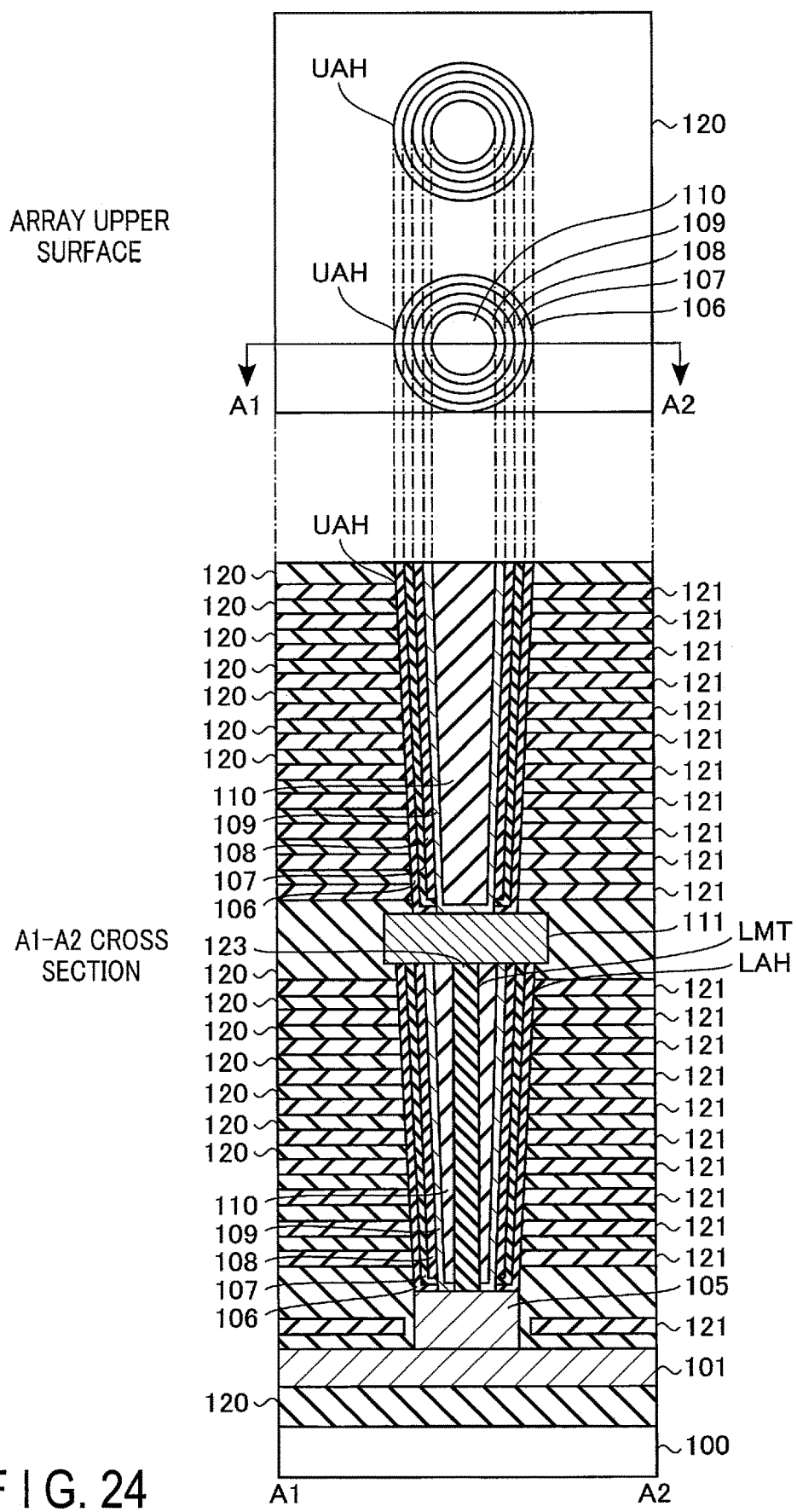

As illustrated in FIG. 24, a hole UAH having a bottom surface reaching the conductive layer 111 is processed. Next, the hole UAH is filled with the block insulating film 106, the charge storage layer 107, the tunnel insulating film 108, the semiconductor layer 109, and the core layer 110 as with the hole LAH.

Figure 25:
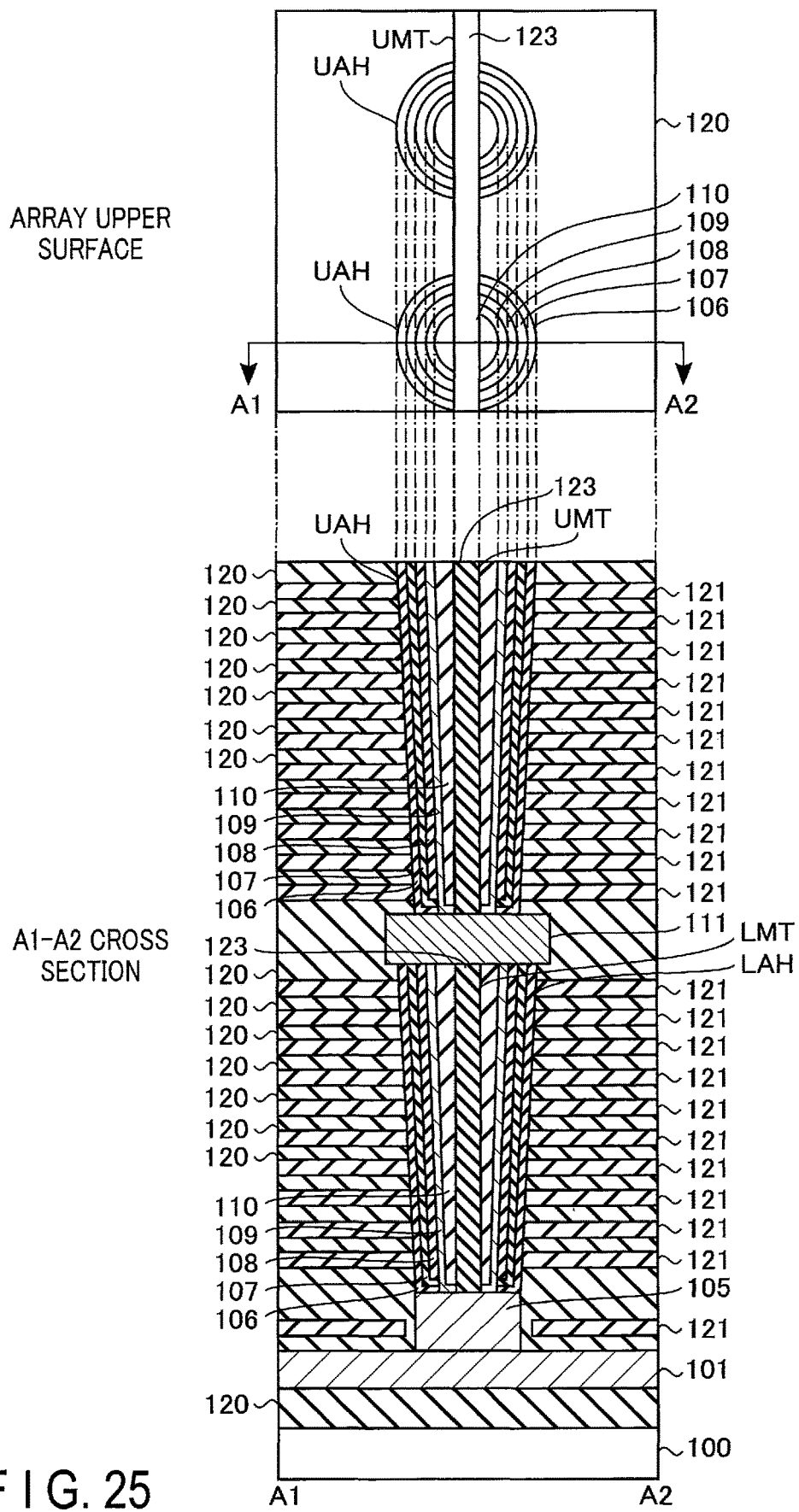

As illustrated in FIG. 25, the memory trench UMT is formed such that the bottom surface reaches the conductive layer 111 and the insulating layer 123 to fill the memory trench LMT, and then the inside of the memory trench UMT is filled with the insulating layer 123. This separates the memory pillar UMP into two in the X direction.

Figure 26:
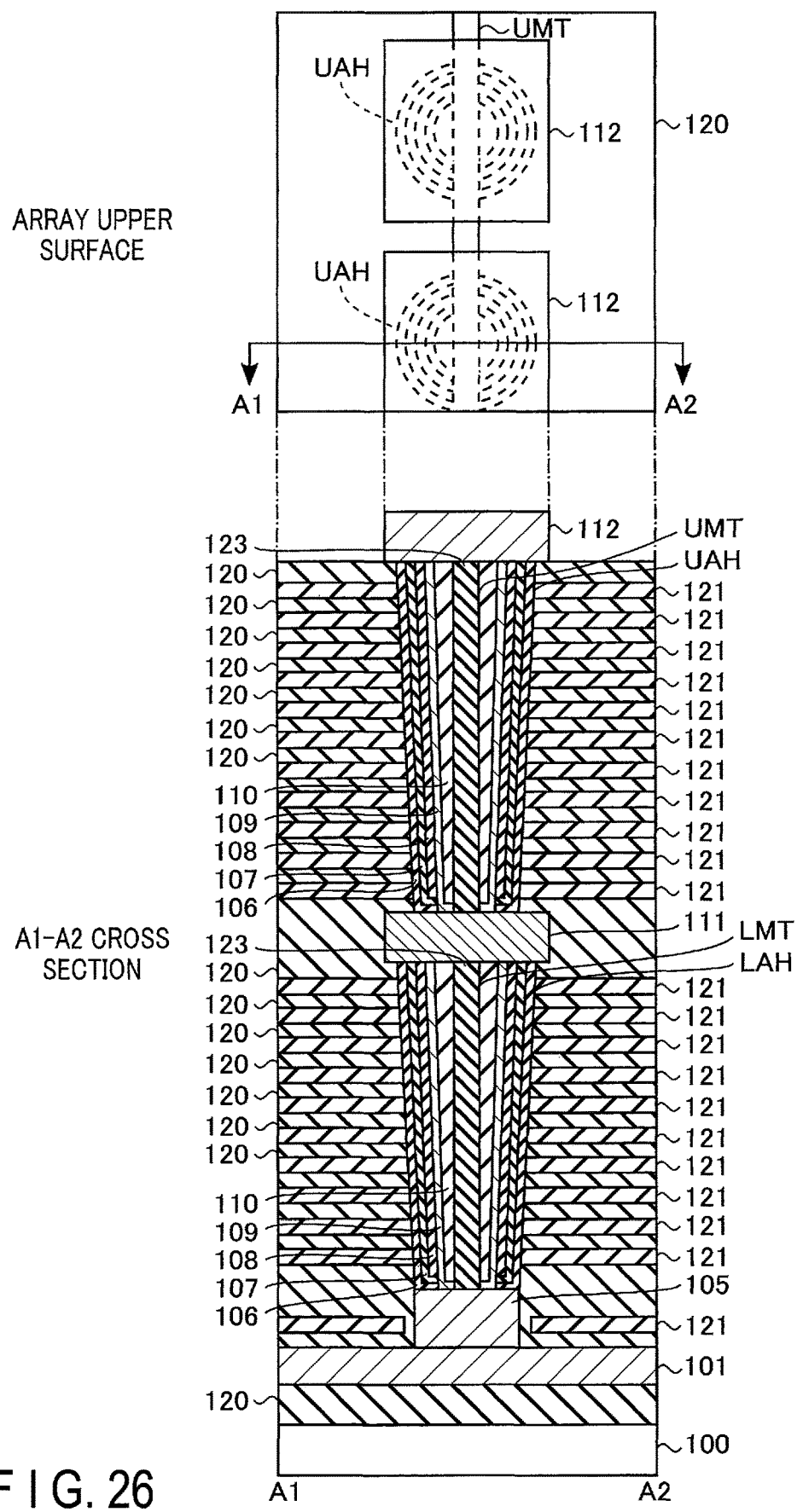

As illustrated in FIG. 26, the conductive layer 112 is formed on the memory pillar UMP.

Figure 27:
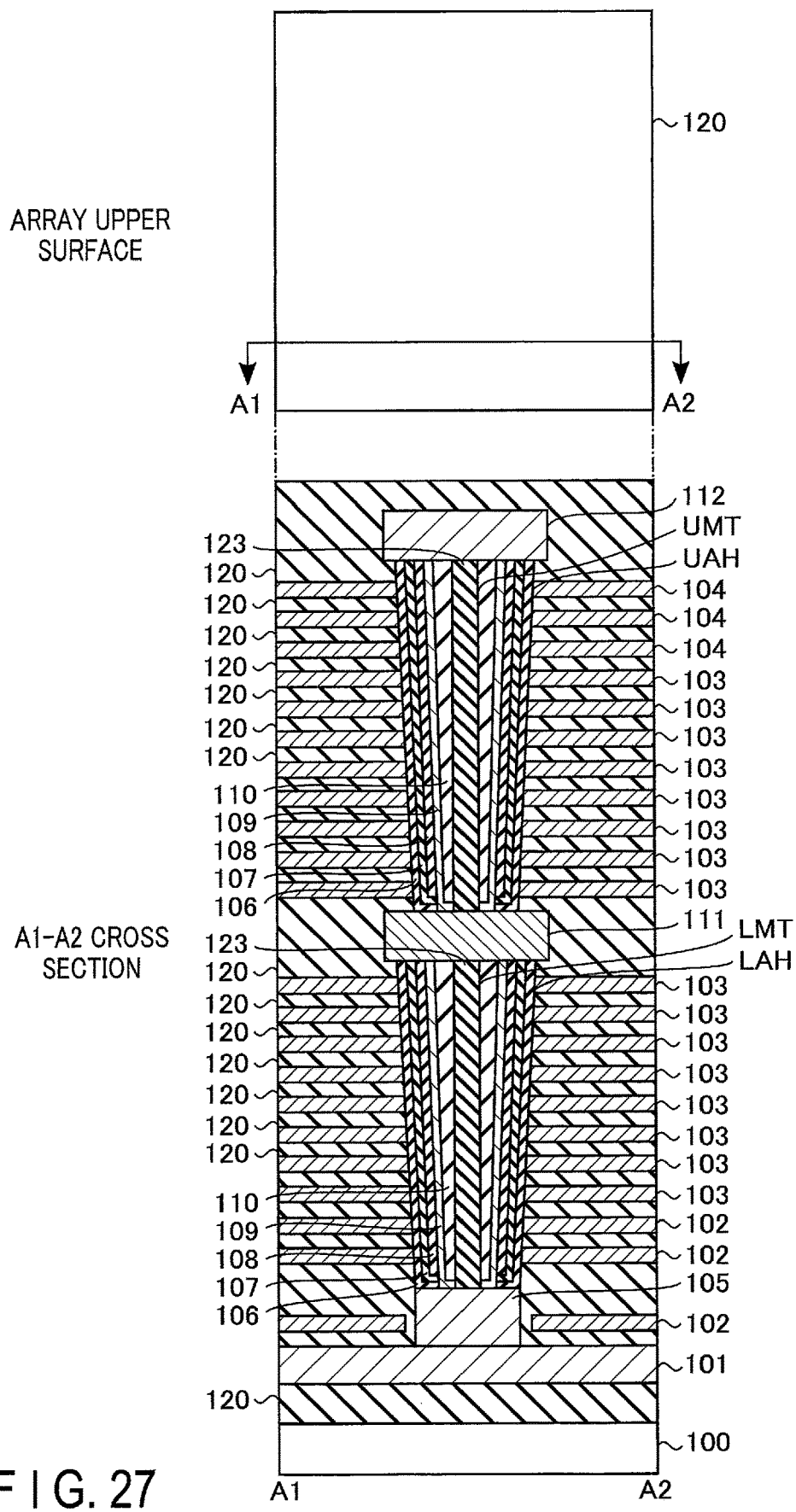

As illustrated in FIG. 27, the conductive layer 112 is covered with the insulating layer 120, and then the interconnect layers 102, 103, and 104 are formed by backfilling as with FIG. 14 of the first embodiment.

3.4 Advantageous Effects of Present Embodiment

It is possible with the structure according to the present embodiment to obtain effects similar to those of the first embodiment. It is to be noted that the present embodiment may be combined with the second embodiment.

4. Fourth Embodiment

Next, a fourth embodiment will be described. In the fourth embodiment, a case in which an FG-type memory cell transistor MC is applied will be described.

4.1 Sectional Structure of Memory Cell Array

Figure 28:
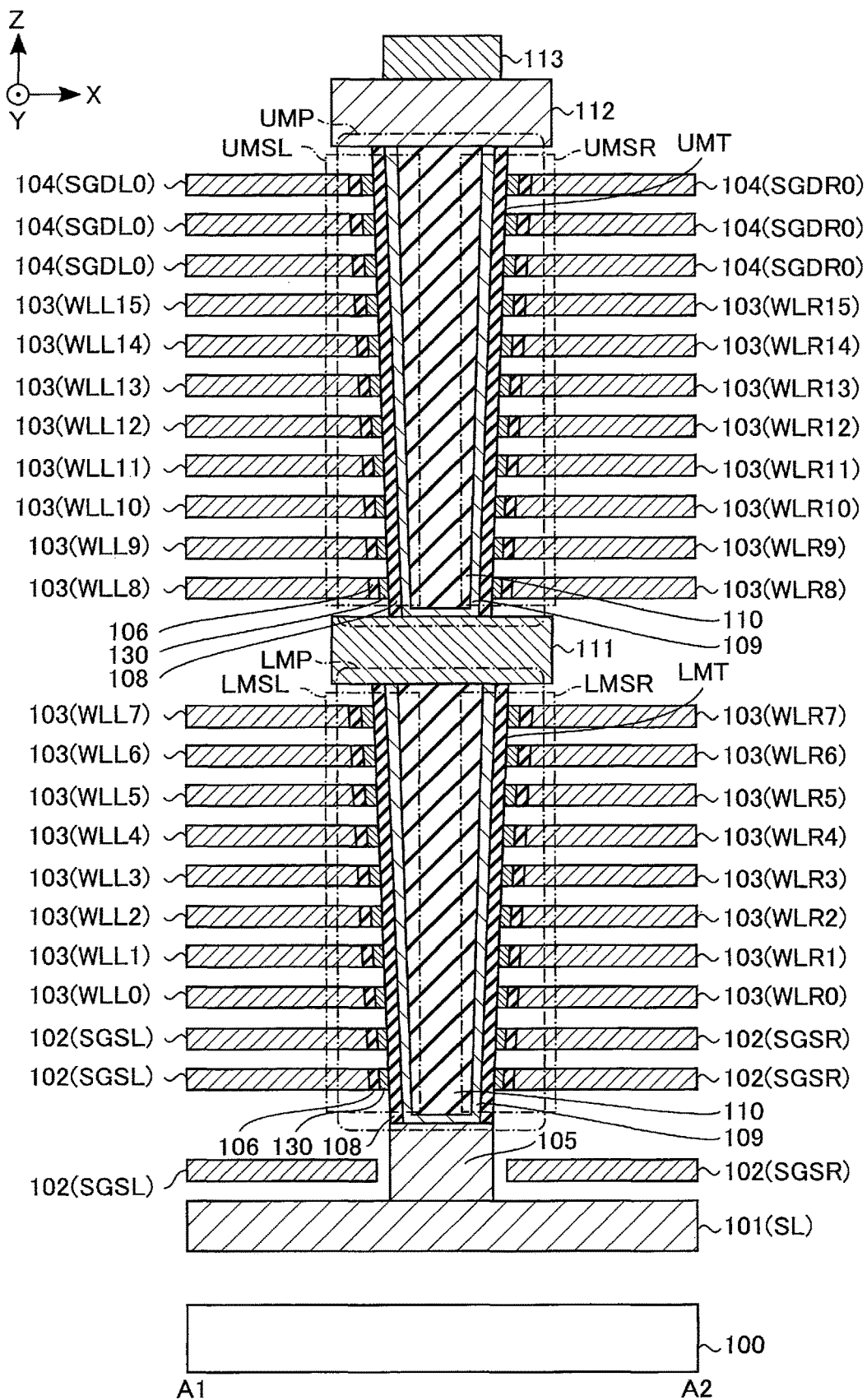
FIG. 28 is a sectional view of a memory cell array provided in a semiconductor memory device according to a fourth embodiment.

The sectional structure of a memory cell array 11 will be described with reference to FIG. 28. FIG. 28 is a sectional view of the memory cell array 11. It is to be noted that interlayer insulating films are omitted in FIG. 28.

In the present embodiment, a plurality of block insulating films 106 and a plurality of charge storage layers 130 are formed corresponding to interconnect layers 102, 103, and 104 as illustrated in FIG. 28. More specifically, one side surface of each block insulating film 106 in the XY plane is in contact with any one side surface of the interconnect layers 102, 103, and 104, and the other side surface in the XY plane is in contact with one side surface of each charge storage layer 130 in the XY plane. In addition, the other side surface of each charge storage layer 130 in the XY plane is in contact with a tunnel insulating film 108 formed on a side surface of a memory trench LMT (or UMT). Polycrystalline silicon, for example, is used for the charge storage layers 130. It is to be noted that the charge storage layers 130 may contain a metal such as tantalum nitride (TaN), TiN, W, or ruthenium (Ru).

Moreover, a semiconductor layer 109 having a side surface in contact with a side surface of the tunnel insulating film 108 and a bottom surface in contact with a semiconductor layer 105 (or conductive layer 111) is formed in a memory trench LMT (or UNIT). The inside of the semiconductor layer 109 is filled with the core layer 110.

4.2 Advantageous Effects of Present Embodiment

It is possible with the structure according to the present embodiment to obtain effects similar to those of the first embodiment.

It is to be noted that the present embodiment may be combined with the second and/or third embodiment.

5. Fifth Embodiment

Next, a fifth embodiment will be described. In the fifth embodiment, two examples are illustrated in a case in which a memory group MG includes six memory strings MS, that is, a case in which three memory pillars MP are stacked. The following description will explain only differences from the first to fourth embodiments.

5.1 First Example

Figure 29:
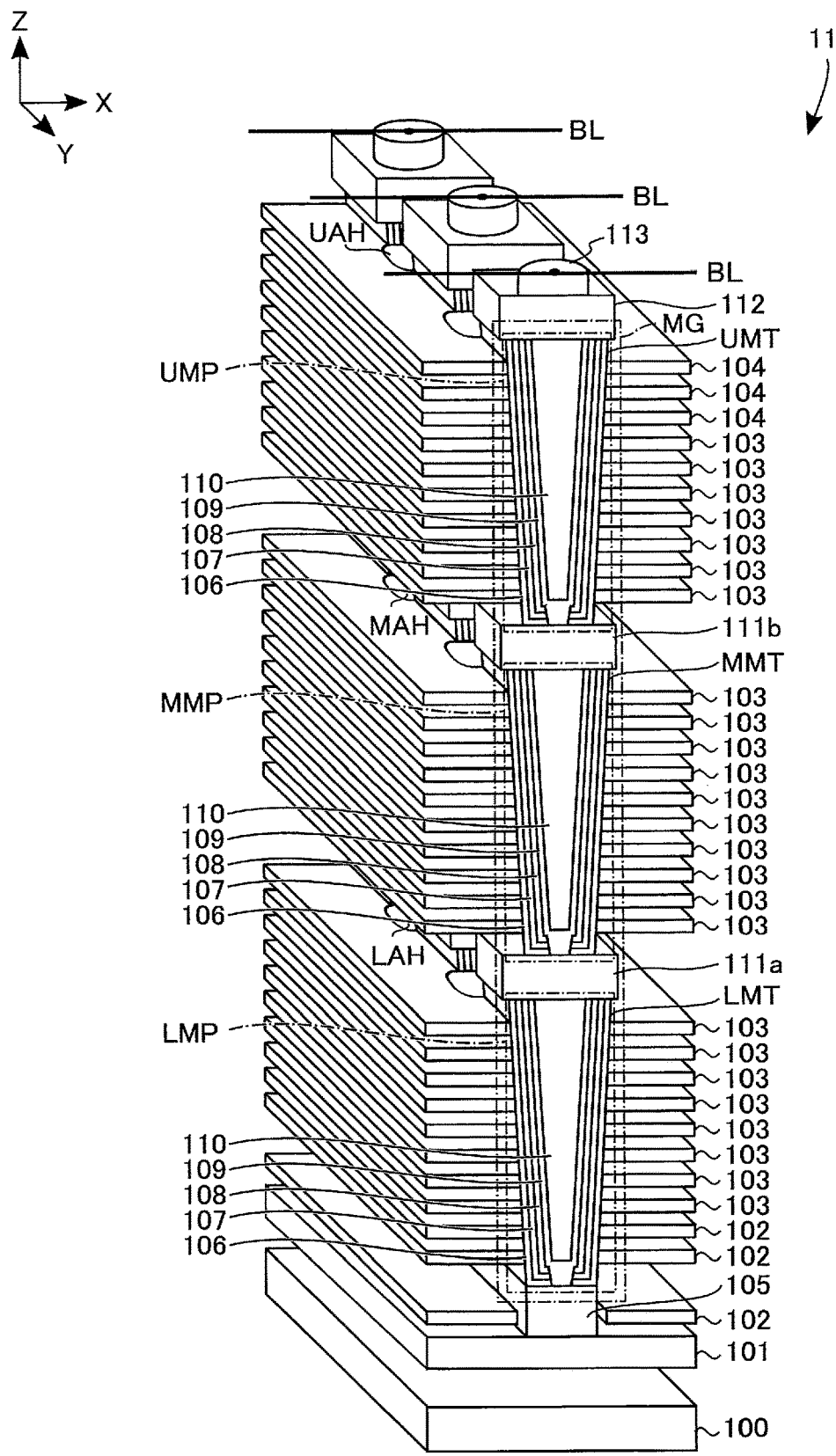
FIG. 29 is a perspective view of a memory cell array provided in a semiconductor memory device according to a first example of a fifth embodiment.

First, a first example will be described with reference to FIG. 29. In the first example, a case in which memory pillars MP described in the second embodiment are stacked in three stages will be described. FIG. 29 is a perspective view corresponding to one block BLK of a memory cell array 11. It is to be noted that some insulating films are omitted in the example of FIG. 29.

As illustrated in FIG. 29, a memory group MG of this example includes memory pillars LMP, MMP, and UMP, a conductive layer 111a which electrically couples the memory pillar LMP to the memory pillar MMP, and a conductive layer 111b which electrically couples the memory pillar MMP to the memory pillar UMP. As with FIG. 16 of the second embodiment, the film thickness of a semiconductor layer 109 in the radial direction of each memory pillar MP is larger in the vicinity of a bottom portion of the memory pillar MP than in an upper end portion of the memory pillar MP. Moreover, conductive layers 111a and 111b are the same as the conductive layer 111 described in the first embodiment.

More specifically, a conductive layer 111a is formed on the memory pillar LMP. Above the conductive layer 111a, ten interconnect layers 103, for example, functioning as word lines WL extending in the Y direction are stacked to be spaced apart in the Z direction. In addition, a memory trench MMT extending in the Y direction and having a bottom surface partly reaching the conductive layer 111a is formed so as to space ten interconnect layers 103 apart in the X direction. As with memory trenches LMT and UMT, the memory trench MMT is filled with the block insulating film 106, the charge storage layer 107, the tunnel insulating film 108, the semiconductor layer 109, and the core layer 110.

A plurality of holes MAH each having a bottom surface reaching a hole LAH or the conductive layer 111a are formed along the Y direction so as to separate the memory trench MMT in the Y direction. One of the separated memory trenches MMT functions as a memory pillar MMP.

In addition, a conductive layer 111b is formed on the memory pillar MMP, and a memory pillar UMP is formed on the conductive layer 111b.

5.2 Second Example

Figure 30:
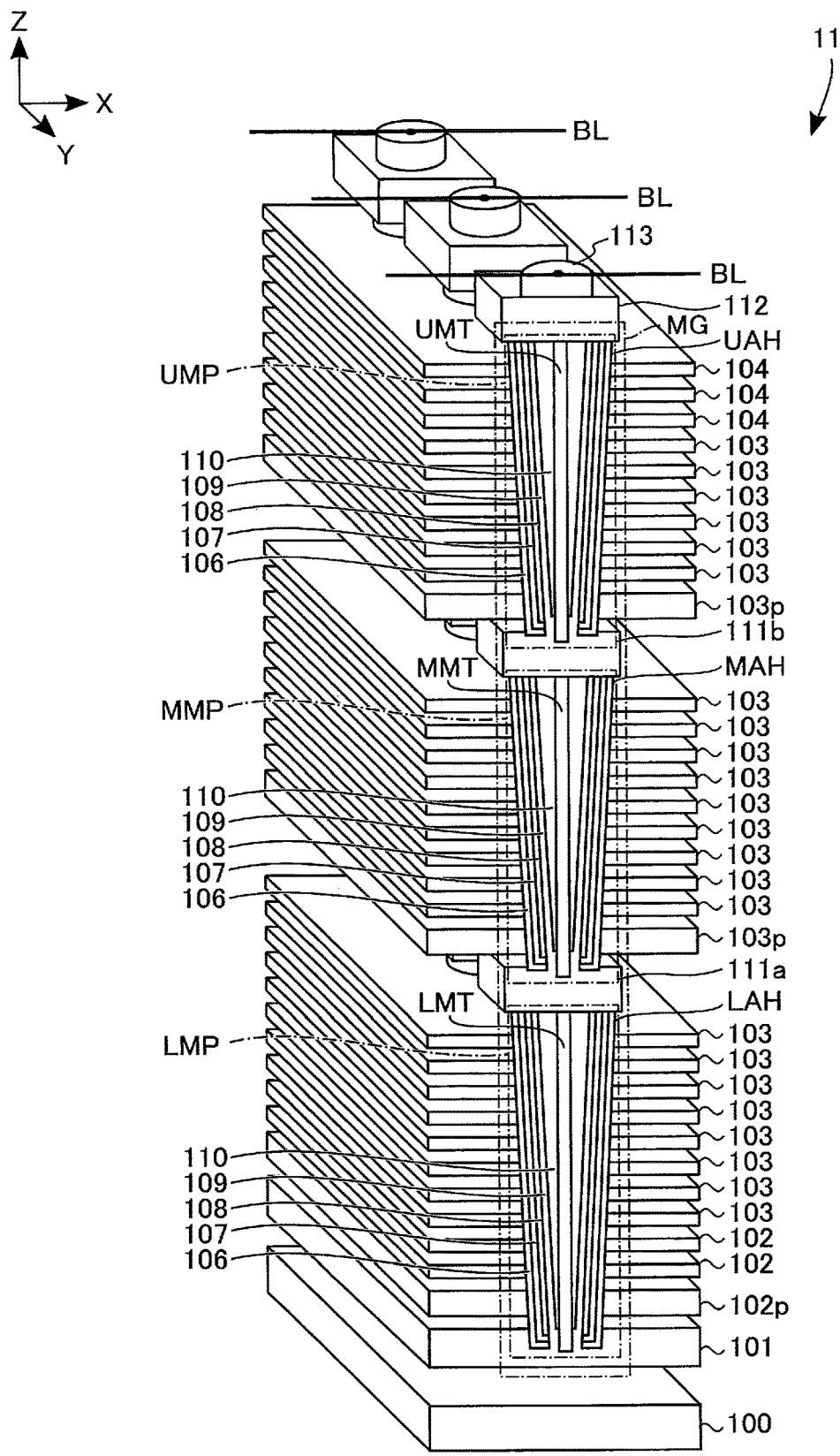
FIG. 30 is a perspective view of a memory cell array provided in a semiconductor memory device according to a second example of the fifth embodiment.

Next, a second example will be described with reference to FIG. 30. In the second example, a case in which a memory pillar MP is formed in a hole LAH as with the third embodiment will be described. FIG. 30 is a perspective view corresponding to one block BLK of the memory cell array 11. It is to be noted that some insulating films are omitted in the example of FIG. 30. Moreover, a semiconductor layer 105 is eliminated in this example.

As illustrated in FIG. 30, an interconnect layer 102p extending in the Y direction is formed above an interconnect layer 101. As with an interconnect layer 102, the interconnect layer 102p functions as a selection gate line SGS, or a gate electrode for generating erasure current at the time of the erase operation. The interconnect layer 102p is made of conductive material, and an n-type semiconductor doped with impurities, for example, is used. Above the interconnect layer 102p, two interconnect layers 102 and eight interconnect layers 103 are stacked to be spaced apart in the Z direction. In addition, a hole LAH penetrating eight interconnect layers 103, two interconnect layers 102, and the interconnect layer 102p and having a bottom surface reaching the interconnect layer 101 is formed. The inside of the hole LAH is filled with the block insulating film 106, the charge storage layer 107, the tunnel insulating film 108, the semiconductor layer 109, and the core layer 110, and a memory pillar LMP is formed. As with FIG. 16 of the second embodiment, the film thickness of the semiconductor layer 109 in the radial direction of the memory pillar LMP is larger in the vicinity of a bottom portion of the memory pillar LMP than in an upper end portion of the memory pillar LMP. In addition, a memory trench LMT extending in the Y direction and having a bottom surface reaching the interconnect layer 101 is formed so as to separate the interconnect layers 102p, 102, and 103, and the memory pillar LMP into two in the X direction. The inside of the memory trench LMT is filled with an insulating layer.

On the memory pillar LMP, a conductive layer 111a is formed. In addition, an interconnect layer 103p functioning as a word line WL as with an interconnect layer 103 is formed above the conductive layer 111a, and furthermore, nine interconnect layers 103, for example, are stacked to be spaced apart in the Z direction above the interconnect layer 103p. As with the interconnect layer 102p, the interconnect layer 103p is made of conductive material, and an n-type semiconductor doped with impurities, for example, is used. A hole MAH penetrating the interconnect layers 103p and 103 is formed, and a memory pillar MMP is formed in the hole MAH as with the memory pillar LMP. In addition, a memory trench MMT extending in the Y direction and having a bottom surface reaching the conductive layer 111a is formed so as to separate the interconnect layers 103p and 103, and the memory pillar MMP into two in the X direction.

A conductive layer 111b is formed on the memory pillar MMP. In addition, an interconnect layer 103p is formed above the conductive layer 111b, and furthermore, six interconnect layers 103 and three interconnect layers 104, for example, are stacked above the interconnect layer 103p to be spaced apart in the Z direction. A hole UAH penetrating the interconnect layers 103p, 103, and 104 is formed, and a memory pillar UMP is formed in the hole UAH as with the memory pillars LMP and MMP. In addition, a memory trench UMT extending in the Y direction and having a bottom surface reaching the conductive layer 111b is formed so as to separate the interconnect layers 103p, 103, and 104, and the memory pillar UMP into two in the X direction.

5.3 Advantageous Effects of Present Embodiment

It is possible with the structure according to the present embodiment to obtain effects similar to those of the first embodiment.

It is to be noted that the first to fifth embodiments can be combined if possible.

6. Variations

The semiconductor memory device according to the above-described embodiments includes: a semiconductor substrate (100); a first signal line (109, MCL7 side) extending in a first direction (Z direction); a second signal line (109, MCR7 side) disposed apart from the first signal line in a second direction (X direction) and extending in the first direction, the second direction crossing the first direction and being parallel to the semiconductor substrate; a first insulating layer (110) provided between the first signal line and the second signal line; a first interconnect layer (103) provided above the semiconductor substrate and extending in a third direction (Y direction), the third direction crossing the first and second directions and being parallel to the semiconductor substrate; a second interconnect layer (103) extending in the third direction; a first memory cell (MCL7) which stores first information by applying voltage across the first signal line and the first interconnect layer; a second memory cell (MCR7) which stores second information by applying voltage across the second signal line and the second interconnect layer; a first conductive layer (111) provided on the first signal line and the second signal line; a third interconnect layer (103) provided above the first interconnect layer and extending in the third direction; a fourth interconnect layer (103) located apart from the third interconnect layer in the second direction and extending in the third direction; a third signal line (109) provided on the first conductive layer and extending in the first direction; a fourth signal line (109) provided on the first conductive layer, disposed apart from the third signal line in the second direction, and extending in the first direction; a second insulating layer (110) provided between the third signal line and the fourth signal line; a third memory cell (MCL8) which stores third information by applying voltage across the third signal line and the third interconnect layer; and a fourth memory cell (MCR8) which stores fourth information by applying voltage across the fourth signal line and the fourth interconnect layer.

By applying the above embodiments, it is possible to provide a semiconductor memory device which can improve reliability.

It is to be noted that embodiments are not limited to the above-described embodiments, and various modifications are possible.

Moreover, "coupling" in the above embodiments also includes a state in which members are coupled indirectly to something such as a transistor or a resistor interposed therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a semiconductor substrate;
a first signal line extending in a first direction;
a second signal line disposed apart from the first signal line in a second direction and extending in the first direction, the second direction crossing the first direction and being parallel to the semiconductor substrate;
a first insulating layer provided between the first signal line and the second signal line;
a first interconnect layer provided above the semiconductor substrate and extending in a third direction, the third direction crossing the first and second directions and being parallel to the semiconductor substrate;
a second interconnect layer located apart from the first interconnect layer in the second direction and extending in the third direction;
a first memory cell which stores first information by applying voltage across the first signal line and the first interconnect layer;
a second memory cell which stores second information by applying voltage across the second signal line and the second interconnect layer;
a first conductive layer provided on the first signal line and the second signal line;
a third interconnect layer provided above the first interconnect layer and extending in the third direction;
a fourth interconnect layer located apart from the third interconnect layer in the second direction and extending in the third direction;
a third signal line provided on the first conductive layer and extending in the first direction;
a fourth signal line provided on the first conductive layer, disposed apart from the third signal line in the second direction, and extending in the first direction;
a second insulating layer provided between the third signal line and the fourth signal line;
a third memory cell which stores third information by applying voltage across the third signal line and the third interconnect layer; and a fourth memory cell which stores fourth information by applying voltage across the fourth signal line and the fourth interconnect layer.

2. The device according to claim 1, wherein
the first signal line and the second signal line are provided between the first interconnect layer and the second interconnect layer, and the third signal line and the fourth signal line are provided between the third interconnect layer and the fourth interconnect layer.

3. The device according to claim 1, further comprising:
a fifth signal line provided between the first interconnect layer and the second interconnect layer, disposed adjacent to the first signal line in the third direction, and extending in the first direction;
a sixth signal line provided between the fifth signal line and the second interconnect layer, disposed adjacent to the second signal line in the third direction, and extending in the first direction; and
a second conductive layer provided on the fifth signal line and the sixth signal line.

4. The device according to claim 3, further comprising:
a seventh signal line provided on the second conductive layer and between the third interconnect layer and the fourth interconnect layer, and extending in the first direction; and
an eighth signal line provided on the second conductive layer and between the seventh signal line and the fourth interconnect layer, and extending in the first direction.

5. The device according to claim 3, wherein
a distance between the first conductive layer and the second conductive layer in the third direction is equal to or less than twice a width of the first memory cell in the second direction.

6. The device according to claim 1, wherein
the first memory cell includes a third insulating layer, a first charge storage layer, and a fourth insulating layer.

7. The device according to claim 1, wherein
the second memory cell includes a fifth insulating layer, a second charge storage layer, and a sixth insulating layer.

8. The device according to claim 1, wherein
the first signal line includes a first portion located on a side of the first conductive layer in the first direction, and a second portion closer to the semiconductor substrate in the first direction than the first portion, and a film thickness of the second portion in the second direction is larger than a film thickness of the first portion in the second direction.

9. The device according to claim 1, further comprising:
a second conductive layer provided on the third signal line and the fourth signal line; and
a third conductive layer coupled to the second conductive layer and extending in the second direction.

10. The device according to claim 1, further comprising:
a semiconductor layer provided under the first signal line and the second signal line; and
a fifth interconnect layer provided under the semiconductor layer.

11. The device according to claim 10, wherein
a bottom surface of the first insulating layer is in contact with the semiconductor layer.

12. The device according to claim 1, further comprising:
a second conductive layer provided on the third signal line and the fourth signal line;
a fifth interconnect layer provided above the third interconnect layer and extending in the third direction;
a sixth interconnect layer located apart from the fifth interconnect layer in the second direction and extending in the third direction;
a fifth signal line provided on the second conductive layer and extending in the first direction;
a sixth signal line provided on the second conductive layer, disposed apart from the fifth signal line in the second direction, and extending in the first direction;
a third insulating layer provided between the fifth signal line and the sixth signal line;
a fifth memory cell which stores fifth information by applying voltage across the fifth signal line and the fifth interconnect layer; and
a sixth memory cell which stores sixth information by applying voltage across the sixth signal line and the sixth interconnect layer.

13. A semiconductor memory device comprising:
a first memory string including a first selection transistor, a first memory cell, and a second memory cell coupled in series;
a second memory string including a second selection transistor and a third memory cell coupled in series;
a third memory string including a third selection transistor and a fourth memory cell coupled in series;
a fourth memory string including a fourth selection transistor and a fifth memory cell coupled in series, an end of a current path of the fifth memory cell being commonly coupled to ends of current paths of the second, third, and fourth memory cells;
a bit line coupled to ends of current paths of the first and second selection transistors;
a source line coupled to ends of current paths of the third and fourth selection transistors;
first to fifth word lines respectively coupled to gates of the first to fifth memory cells;
first to fourth selection gate lines respectively coupled to gates of the first to fourth selection transistors;
a row decoder coupled to the first to fifth word lines and the first to fourth selection gate lines; and
a control circuit which controls the row decoder.

14. The device according to claim 13, wherein
the control circuit controls the row decoder to apply reading voltage to the first word line, to apply first voltage higher than the reading voltage to the second, fourth, and fifth word lines so as to turn on the second, fourth, and fifth memory cells and put the third word line into a floating state, to apply second voltage higher than the reading voltage to the first, third, and fourth selection gate lines so as to turn on the first, third, and fourth selection transistors, and to apply third voltage lower than the reading voltage to the second selection gate line so as to turn off the second selection transistor, in read operation of the first memory cell.

15. The device according to claim 13, wherein
current flows from the bit line to the source line via the first, third, and fourth memory strings when the first memory cell is in an ON state in the read operation of the first memory cell.

* * * * *